(12) United States Patent
Yamazaki et al.

(10) Patent No.: US 8,698,137 B2
(45) Date of Patent: Apr. 15, 2014

(54) SEMICONDUCTOR DEVICE

(75) Inventors: Shunpei Yamazaki, Tokyo (JP); Jun Koyama, Kanagawa (JP)

(73) Assignee: Semiconductor Energy Laboratory Co., Ltd., Kanagawa (JP)

( * ) Notice: Subject to any disclaimer, the term of this patent is extended or adjusted under 35 U.S.C. 154(b) by 23 days.

(21) Appl. No.: 13/604,669

(22) Filed: Sep. 6, 2012

(65) Prior Publication Data

US 2013/0062607 A1 Mar. 14, 2013

(30) Foreign Application Priority Data

Sep. 14, 2011 (JP) .................... 2011-200896

(51) Int. Cl.
*H01L 29/10* (2006.01)

(52) U.S. Cl.
USPC .................. 257/43; 257/40; 257/57; 257/59; 257/71; 257/83

(58) Field of Classification Search
None
See application file for complete search history.

(56) References Cited

U.S. PATENT DOCUMENTS

| 7,399,991 B2 | 7/2008 | Seo et al. |
| 7,663,149 B2 | 2/2010 | Seo et al. |
| 2006/0017139 A1 | 1/2006 | Eguchi et al. |
| 2009/0310265 A1 | 12/2009 | Fukuoka et al. |
| 2009/0321869 A1 | 12/2009 | Fukuoka et al. |
| 2010/0102313 A1 | 4/2010 | Miyairi et al. |
| 2010/0102314 A1 | 4/2010 | Miyairi et al. |
| 2010/0117079 A1 | 5/2010 | Miyairi et al. |
| 2010/0202090 A1 | 8/2010 | Shishido et al. |
| 2010/0244020 A1 | 9/2010 | Sakata et al. |
| 2010/0253478 A1 | 10/2010 | Koyama et al. |
| 2010/0301326 A1 | 12/2010 | Miyairi et al. |
| 2010/0328916 A1 | 12/2010 | Hirose et al. |
| 2011/0084263 A1 | 4/2011 | Yamazaki et al. |
| 2011/0109351 A1 | 5/2011 | Yamazaki et al. |
| 2011/0133177 A1 | 6/2011 | Suzawa et al. |
| 2011/0156025 A1 | 6/2011 | Shionoiri et al. |
| 2011/0199351 A1 | 8/2011 | Kurokawa |
| 2011/0204365 A1 | 8/2011 | Saito |
| 2011/0248261 A1 | 10/2011 | Yamazaki |
| 2012/0032785 A1 | 2/2012 | Kamata |
| 2012/0061662 A1 | 3/2012 | Yamazaki et al. |
| 2012/0061668 A1 | 3/2012 | Miyairi et al. |
| 2012/0104385 A1 | 5/2012 | Godo et al. |
| 2012/0104386 A1 | 5/2012 | Miyairi et al. |
| 2012/0112191 A1 | 5/2012 | Kato et al. |
| 2012/0161127 A1 | 6/2012 | Kato et al. |
| 2012/0326951 A1* | 12/2012 | Yamazaki et al. ............ 345/76 |

FOREIGN PATENT DOCUMENTS

| JP | 2002-324673 | 11/2002 |
| JP | 2006-060191 | 3/2006 |

* cited by examiner

*Primary Examiner* — Kyoung Lee
(74) *Attorney, Agent, or Firm* — Nixon Peabody LLP; Jeffrey L. Costellia

(57) ABSTRACT

A protection circuit for efficiently reducing the influence of ESD and a semiconductor device in which the influence of ESD is efficiently reduced are provided. The protection circuit includes at least two protection diodes. Each protection diode is a transistor including two gates facing each other with a semiconductor layer in which a channel is formed sandwiched between the gates. A fixed potential is applied to one of the gates of the transistor.

17 Claims, 12 Drawing Sheets

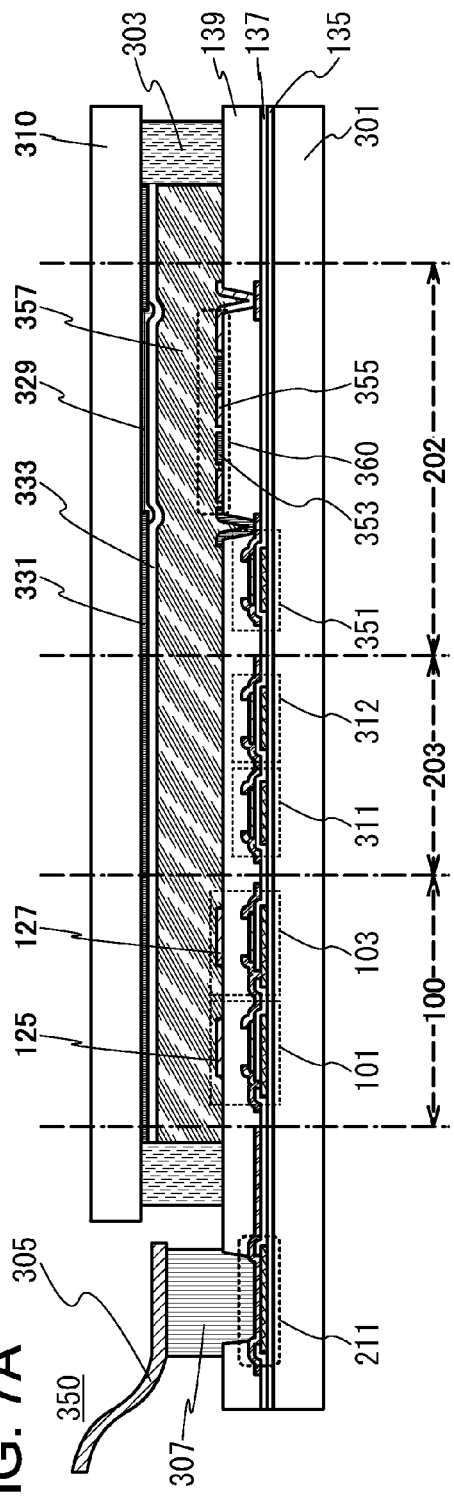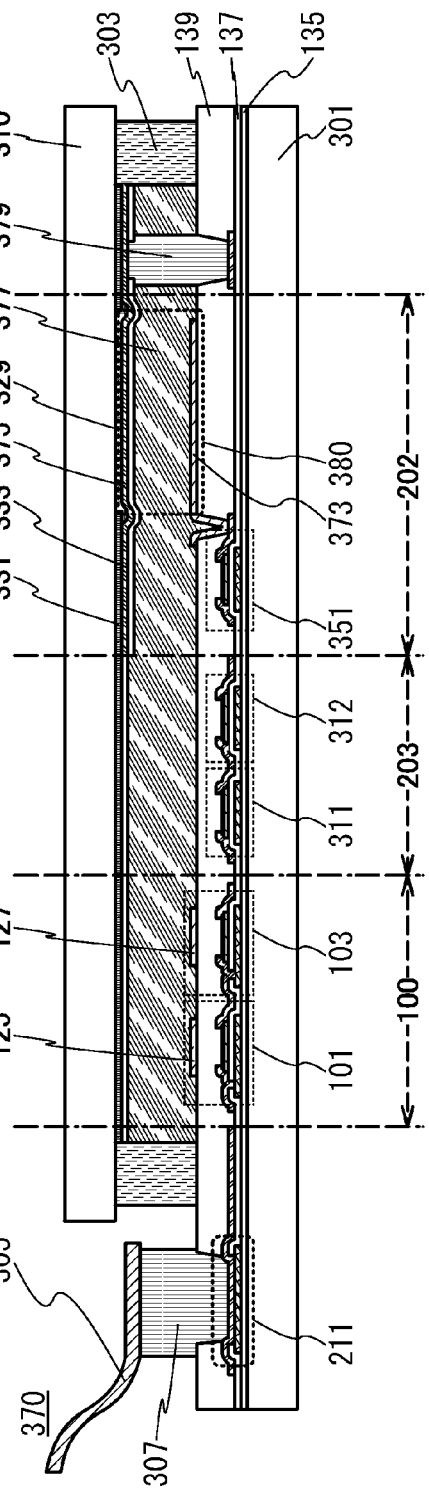

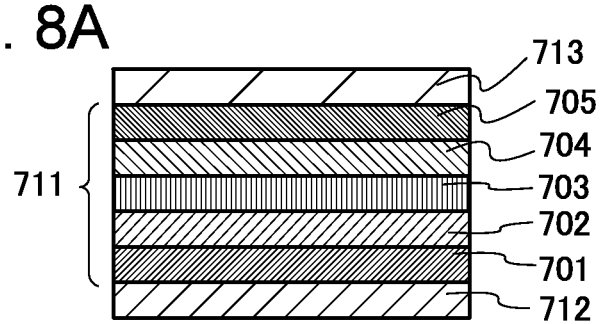
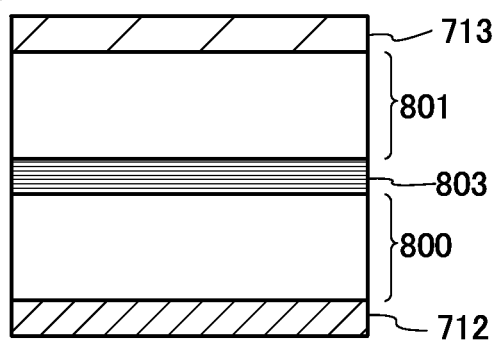
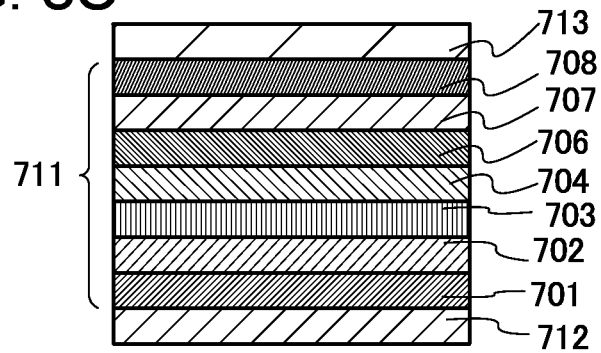

SEMICONDUCTOR DEVICE

BACKGROUND OF THE INVENTION

1. Field of the Invention

The present invention relates to a protection circuit for protection from electro static discharge (ESD) and to a semiconductor device.

2. Description of the Related Art

A known example of semiconductor devices fabricated using semiconductor technology is display devices. Examples of such display devices include liquid crystal display devices and organic electroluminescent (EL) display devices.

A liquid crystal display device, in which a liquid crystal is sandwiched between a pair of electrodes in each pixel, displays an image by controlling the amount of light from the backlight on its rear side passing through the pixel, using light polarization produced by the liquid crystal. Examples of liquid crystal display devices include passive-matrix liquid crystal display devices and active-matrix liquid crystal display devices using thin film transistors (TFTs).

Organic EL elements have been actively researched and developed. A general organic EL element is composed of a pair of electrodes and a layer containing a light-emitting organic compound sandwiched between the electrodes. When voltage is applied to the element, the light-emitting organic compound emits light.

Like a liquid crystal display device, a display device using organic EL elements employs passive-matrix addressing, active-matrix addressing, or the like. An organic EL element, which is a self-light-emitting element that can be formed in a film shape, does not require a backlight unlike a liquid crystal display device and the like, resulting in a thin lightweight high-contrast display device that consumes less power. Patent Document 1, for example, discloses an example of a display device using organic EL elements.

However, when external pulse potential due to ESD is applied to such a display device through an external input terminal, display quality decreases due to noise and internal circuitry malfunctions. Moreover, when very high potential due to ESD is applied to the display device, a functional element in the internal circuitry may be damaged. Such potential due to ESD may be applied to not only the external input terminal, but also a direct input line or a wiring connected to pixels and the like.

As a device for solving the above problems, a protection circuit that protects internal circuitry from pulse potential due to ESD is known. Patent Document 2 discloses a technique to configure a protection circuit using thin film transistor technology.

REFERENCE

[Patent Document 1] Japanese Published Patent Application No. 2002-324673
[Patent Document 2] Japanese Published Patent Application No. 2006-060191

SUMMARY OF THE INVENTION

However, the technique disclosed in Patent Document 2 is used to ensure normal operation of circuitry even after damage to a PIN diode, which means a protection circuit using a diode including a semiconductor film does not have a sufficient performance.

In view of the foregoing, it is an object of the present invention to provide a protection circuit that efficiently suppresses the influence of ESD and to provide a semiconductor device in which the influence of ESD is efficiently suppressed.

One embodiment of the present invention solves at least one of the above problems.

A protection circuit according to one embodiment of the present invention includes at least two protection diodes. The protection diodes are transistors each including two gates facing each other with a semiconductor layer in which a channel is formed sandwiched between the gates. A fixed potential is applied to one of the gates.

A fixed potential is applied to one of the gates of each of the two transistors in the protection circuit such that the transistors are not turned on in a steady state (the state where potential due to ESD is not applied). With this configuration, in each transistor, capacitance can be added between a channel region and the gate to which the fixed potential is applied. When pulse potential due to ESD is applied to a wiring electrically connected to the protection circuit (also called protected wiring), the capacitance causes a delay in change of the potential of the protected wiring. Thus, the slope of the rising edge of input potential due to ESD becomes gradual and the maximum value of potential input to the protected wiring (such a value is called "arriving potential") is reduced, so that the influence of ESD can be efficiently suppressed.

By adding capacitance using one of the gates of the transistor instead of forming an additional capacitor, the influence of ESD can be efficiently suppressed without increasing the area of the circuit.

A protection circuit according to one embodiment of the present invention includes a first diode and a second diode. The first diode is a first transistor. The second diode is a second transistor. The first transistor includes a first gate and a second gate facing each other with a semiconductor layer in which a channel is formed sandwiched between the first gate and the second gate. The second transistor includes a third gate and a fourth gate facing each other with a semiconductor layer in which a channel is formed sandwiched between the third gate and the fourth gate. The second gate and the fourth gate are electrically connected to a wiring to which a fixed potential is applied.

A protection circuit according to another embodiment of the present invention includes an input portion, a first transistor, and a second transistor. The first transistor includes a first electrode and a second electrode, and a first gate and a second gate facing each other with a first semiconductor layer in which a channel is formed sandwiched between the first gate and the second gate. The second transistor includes a third electrode and a fourth electrode, and a third gate and a fourth gate facing each other with a second semiconductor layer in which a channel is formed sandwiched between the third gate and the fourth gate. The first electrode is electrically connected to a first wiring. The second electrode, the third electrode, and the first gate are electrically connected to the input portion. The fourth electrode and the third gate are electrically connected to a second wiring. The second gate and the fourth gate are electrically connected to a third wiring. A first potential is applied to the first wiring. A second potential lower than the first potential is applied to the second wiring. A third potential lower than the first potential is applied to the third wiring.

The above structure is preferable because it enables a protection circuit to be formed using only n-channel transistors with high field-effect mobility, and thus enables the circuit to be formed in a process for fabricating transistors of a single conductivity type and to operate at high speed.

A fixed potential is constantly applied to one of the gates of each of the two transistors included in the protection circuit in the steady state. The fixed potential puts the transistors in the off state reliably in the steady state, leading to a stable operation of the protection circuit and a reduction in the power consumption of the protection circuit.

A semiconductor device according to one embodiment of the present invention includes any of the above protection circuits, a display portion including a plurality of pixels, a driver circuit for driving the plurality of pixels, and an external input terminal to which a signal from the outside is input. The external input terminal is electrically connected to the driver circuit.

When the protection circuit is used in a display device including a plurality of pixels and driver circuits for driving the pixels, the influence of ESD in the display device can be efficiently reduced.

In the semiconductor device according to one embodiment of the present invention, the protection circuit is preferably electrically connected between the driver circuit and the external input terminal.

For a semiconductor device with this structure, the driver circuits are not damaged when a pulse potential due to ESD is applied through an external input terminal to which a power supply potential, a common potential, or a signal such as a drive signal is input. Thus, the influence of ESD in the semiconductor device can be efficiently reduced and the semiconductor device can exhibit high reliability.

The semiconductor device according to any of the above embodiments of the present invention preferably includes a plurality of the protection circuits. The display portion includes a plurality of scan lines and a plurality of signal lines. The plurality of the protection circuits are electrically connected to the respective plurality of scan lines, the respective plurality of signal lines, or the respective plurality of scan lines and the respective plurality of signal lines.

For a semiconductor device with this structure, even when a pulse potential due to ESD is applied to a scan line or a signal line in a display portion not only through an external input terminal but directly, a functional element in a pixel, such as a transistor, or a driver circuit electrically connected to a pixel, is not damaged. Thus, the semiconductor device can exhibit high reliability.

In the semiconductor device according to any of the above embodiments of the present invention, the third wiring electrically connected to the second gate and the fourth gate in the protection circuit is preferably provided along at least a part of the display portion, further preferably forms a closed curve surrounding the display portion.

A wiring electrically connected to one of the gates of each of the transistors in the protection circuit is provided so as to form a closed curve surrounding the pixels or the driver circuits, or both. With this structure, electrical noise from the outside can be suppressed. Further, the wiring acts as a current path that passes a potential due to ESD caused in a process for fabricating the semiconductor device or use of the semiconductor device, so that application of a high potential to the pixels or the driver circuits can be suppressed.

Even when a pulse potential due to ESD is directly applied to the wiring electrically connected to one of the gates of each of the transistors, capacitance added to the transistors in the protection circuit causes a delay of the pulse potential applied to the wiring, thereby reducing the potential.

In the semiconductor device according to any of the above embodiments of the present invention, the pixel includes a light-emitting element having a pixel electrode and a common electrode between which a layer including a light-emitting organic compound is sandwiched, and the second gate and the fourth gate in the protection circuit are formed by the same conductive film as the pixel electrode.

In the semiconductor device according to any of the above embodiments of the present invention, the pixel includes a display element including a pixel electrode, a common electrode, and a liquid crystal. The second gate and the fourth gate in the protection circuit are formed by the same conductive film as the pixel electrode.

As described above, one of the gates of each of the transistors in the protection circuit is formed by the same conductive film as the pixel electrode in the pixel, leading to a highly reliable EL display device or liquid crystal display device in which the influence of ESD is suppressed without increasing the number of fabrication steps.

Note that a "closed curve" in this specification and the like means a continuous curve with no endpoints. Further, here, a "curve" includes concepts of a straight line and a line segment in its broad sense. Therefore, the case where a plurality of line segments are included and every end point of the line segments overlaps with another end point, such as a periphery of a quadrangle, is also one mode of the closed curve. Further, a polygon, a circle, an ellipse, a shape in which a plurality of curves having different curvatures is continuously connected, a shape including a straight line and a curve, or the like is also one mode of the closed curve.

Note that in this specification, an "EL layer" refers to a layer provided between a pair of electrodes in a light-emitting element. Thus, a light-emitting layer containing an organic compound that is a light-emitting substance which is interposed between electrodes is an embodiment of the EL layer.

Note that in this specification, a display device fabricated using semiconductor technology is an embodiment of a semiconductor device. In addition, the display device includes any of the following modules in its category: a module in which a connector such as a flexible printed circuit (FPC) or a tape carrier package (TCP) is attached to a display device; a module having a TCP provided with a printed wiring board at the end thereof; and a module having an integrated circuit (IC) directly mounted over a substrate over which a light-emitting element is formed by a chip on glass (COG) method.

The present invention provides a protection circuit that efficiently suppresses the influence of ESD and a semiconductor device in which the influence of ESD is efficiently suppressed.

BRIEF DESCRIPTION OF THE DRAWINGS

FIGS. 7A and 7B are diagrams each illustrating a display device according to one embodiment of the present invention.

FIGS. 8A to 8C are diagrams each illustrating an EL element according to one embodiment of the present invention.

DETAILED DESCRIPTION OF THE INVENTION

Figure 1:
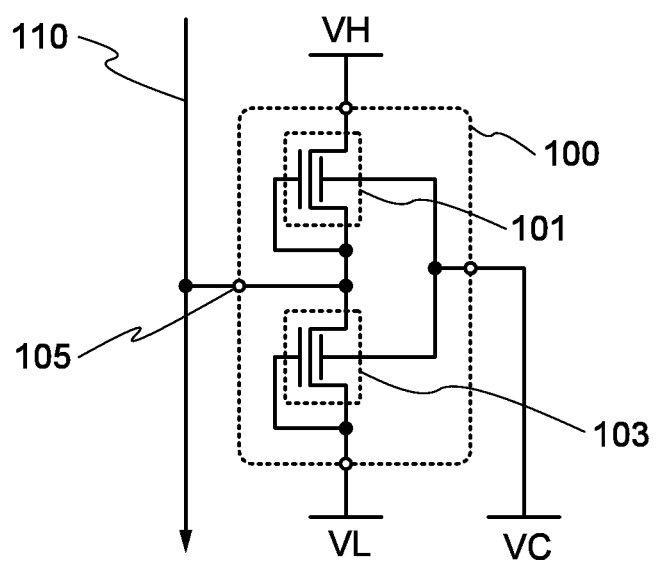
FIG. 1 is a diagram illustrating a protection circuit according to one embodiment of the present invention.

Embodiments will be described in detail with reference to the drawings. Note that the present invention is not limited to the following description, and it will be easily understood by those skilled in the art that various changes and modifications can be made without departing from the spirit and scope of the present invention. Therefore, the present invention should not be construed as being limited to the description in the following embodiments. Note that in the structures of the invention described below, the same portions or portions having similar functions are denoted by the same reference numerals in different drawings, and description of such portions is not repeated.

Note that in each drawing referred to in this specification, the size, the layer thickness, or the region of each component is exaggerated for clarity in some cases. Therefore, embodiments of the present invention are not limited to such scales.

Note that in this specification and the like, ordinal numbers such as first and second are used for convenience for preventing confusion between components, and thus do not set a numerical limit and do not indicate a proper name as an item for specifying the present invention.

A transistor is a kind of semiconductor element and can achieve amplification of a current or a voltage, switching operation for controlling conduction or non-conduction, or the like. A transistor in this specification includes an insulated-gate field effect transistor (IGFET) and a thin film transistor (TFT).

The functions of a "source" and a "drain" might interchange when a transistor of opposite conductivity type is used or the direction of current flow is changed in circuit operation, for example. Thus, in this specification, the terms "source" and "drain" can interchange.

In this specification and the like, one of a source and a drain of a transistor is referred to as "first electrode" and the other of the source and the drain of the transistor is referred to as "second electrode" in some cases. In that case, a gate of the transistor is referred to as "gate" or "gate electrode".

In this specification and the like, the expression "electrically connected" means that components are connected to each other through an object having any electric action. Here, there is no particular limitation on an object having any electric action as long as electric signals can be transmitted and received between components that are connected to each other through the object. Examples of an object having any electric action include an electrode, a wiring, a switching element such as a transistor, a resistor, a coil, a capacitor, and an element with a variety of functions.

(Embodiment 1)

This embodiment describes a protection circuit according to one embodiment of the present invention with reference to drawings.

[Structure Example]

FIG. 1 illustrates a protection circuit 100 according to one embodiment of the present invention, which is taken as an example in this structure example.

A protection circuit 100 is electrically connected to a high potential line VH, a low potential line VL, and a common potential line VC. An input portion 105 of the protection circuit 100 is electrically connected to a protected wiring 110.

The protection circuit 100 includes a transistor 101 and a transistor 103. In this structure example, the case where both the transistor 101 and the transistor 103 are n-channel transistors is described.

The transistor 101 and the transistor 103 each include a first electrode which is one of a source and a drain, a second electrode which is the other of the source and the drain, a first gate, and a second gate.

The first electrode of the transistor 101 is electrically connected to the high potential line VH. The first gate and second electrode of the transistor 101 are electrically connected to the first electrode of the transistor 103. The first gate and second electrode of the transistor 103 are electrically connected to the low potential line VL. Therefore, the transistors 101 and 103, the gate of which is electrically connected to one of the source and the drain, function as diode elements.

The second gates of the transistors 101 and 103 are electrically connected to the common potential line VC.

A potential higher than that applied to the low potential line VL is applied to the high potential line VH. The fixed potential applied to the common potential line VC is a value at which at least the transistors 101 and 103 are kept off during the steady state (the state where potential due to ESD is not applied). The potential applied to the common potential line VC, which is determined by the threshold voltages of the transistors dependent on the potentials applied to the second gates of the transistors, is, for example, a potential lower than or equal to that applied to the high potential line VH. As the potential applied to the common potential line VC, the potential applied to the low potential line VL, a reference potential, a ground potential, or the like is preferably used. The potential applied to the high potential line VH is hereinafter called Vh; the potential applied to the low potential line VL, Vl; and the potential applied to the common potential line VC, Vc.

The node between the second electrode of the transistor 101 and the first electrode of the transistor 103 corresponds to the input portion 105 of the protection circuit 100. In this structure example, the protected wiring 110 is electrically connected to the protection circuit 100 through the input portion 105.

In this structure example, two transistors with the same electrical characteristics are used as the transistors 101 and 103. In addition, Vth denotes the threshold voltage of each of the transistors 101 and 103 dependent on the potential applied to the first gate of the transistor in the steady state where a fixed potential is applied to the second gate of the transistor.

In this structure example, both of the transistors 101 and 103 are n-channel transistors, but the transistor 101 or 103, or both may be a p-channel transistor. When a p-channel transistor is used, connection of its first gate is changed as appropriate. When both of the two transistors are p-channel transistors, a potential higher than the potential Vh which is applied to the high potential line VH is used as a potential Vc which is applied to the common potential line VC. When one of the transistors is an n-channel transistor, and the other is a p-channel transistor, a potential higher than Vl and lower than Vh is used as Vc.

[Circuit Operation Example]

The operation of the protection circuit 100 will now be described.

In the steady state, a reverse-bias voltage is applied to the transistors 101 and 103 functioning as diodes. Thus, the transistors 101 and 103 are both in the off state where they have very high input impedance. The input portion 105 is therefore insulated from the high potential line VH and the low potential line VL, so that the potentials of these lines have little impact on the potential of the protected wiring 110.

Therefore, in the steady state, even when signals of potentials each ranging from Vl to Vh are input to the protected wiring 110, the signals are hardly influenced.

Then, suppose that a very high pulse potential, specifically, a potential higher than or equal to the sum of the potential Vh which is applied to the high potential line VH and the threshold voltage of the transistor 101 (Vh+Vth) is applied to the protected wiring 110 due to ESD.

When the pulse potential is applied to the input portion 105 electrically connected to the protected wiring 110, the transistor 101 is turned on, causing current to flow from the input portion 105 to the high potential line VH. This suppresses an abrupt change in the potential of the protected wiring 110 due to ESD.

Here, the fixed potential Vc from the common potential line VC is applied to the second gate of the transistor 101. Therefore, capacitance is added between the channel region and second gate of the transistor 101. This capacitance acts as parasitic capacitance, which causes the delay of the pulse potential due to ESD applied to the input portion 105 and the slope of the rising edge of the pulse potential becomes gradual, thereby efficiently reducing the value of the arriving potential.

At this time, the fixed potential Vc is also applied to the second gate of the transistor 103, so that capacitance is also added between the first electrode and second gate of the transistor 103. Thus, the slope of the rising edge of the pulse potential due to ESD becomes gradual, thereby more efficiently reducing the potential.

As a result, even when the input pulse potential due to ESD is very instantaneous and high, the potential can be efficiently reduced; thus, not only the circuit elements electrically connected to the protected wiring 110 but also the transistors in the protection circuit can be protected.

In contrast, when a very low pulse potential, specifically, a potential lower than (Vl−Vth) is applied to the protected wiring 110, the transistor 103 is turned on, so that current flows from the low potential line VL to the protected wiring 110, increasing the potential of the protected wiring 110. This suppresses an abrupt change in the potential of the protected wiring 110 due to ESD.

At this time, Vc is applied to the second gate of the transistor 103 as in the above-described case. Therefore, capacitance added between the channel region and second gate of the transistor 103 makes the slope of the rising edge of the input pulse waveform due to ESD gradual, thereby efficiently reducing the arriving potential. At the same time, capacitance between the second electrode and second gate of the transistor 101 also makes the slope of the rising edge of the pulse waveform gradual.

As described above, in the protection circuit according to one embodiment of the present invention, the second gate of the transistor is electrically connected to the wiring to which a fixed potential is applied; thus, capacitance between the channel region and second gate of the transistor efficiently makes the slope of the rising edge of the input pulse potential gradual, thereby reducing arriving potential. Therefore, not only the circuit elements electrically connected to the protected wiring but also the transistors in the protection circuit can be efficiently protected.

In addition, the fixed potential applied to the second gates of the transistors in the protection circuit puts the transistors in the off state reliably in the steady state, which enables stable circuit operation. Moreover, the leakage current of the transistor in the steady state is suppressed, so that an increase in the power consumption of the protection circuit can be suppressed. Thus, the protection circuit consumes less power.

This embodiment has described the case where the protection circuit 100 includes two transistors functioning as diodes, but the protection circuit 100 may include three or more transistors. For example, a transistor having the same structure as the transistor 101 is additionally connected in series between the input portion 105 and the high potential line VH, in which case the potential at which the protection circuit 100 operates increases by Vth. Moreover, capacitance is added between a channel region and a second gate electrode of the transistor connected in series; thus, the slope of the rising edge of the input pulse potential can be made gradual more efficiently.

[Application]

Figure 2A:
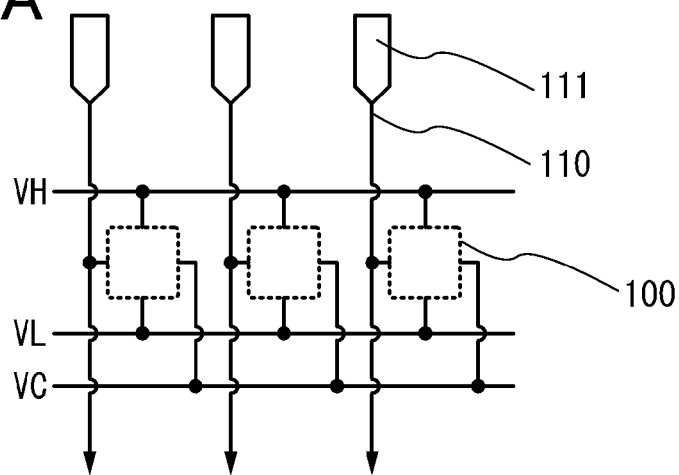
FIGS. 2A and 2B are diagrams illustrating examples of connections in the protection circuit according to one embodiment of the present invention.
Figure 2B:
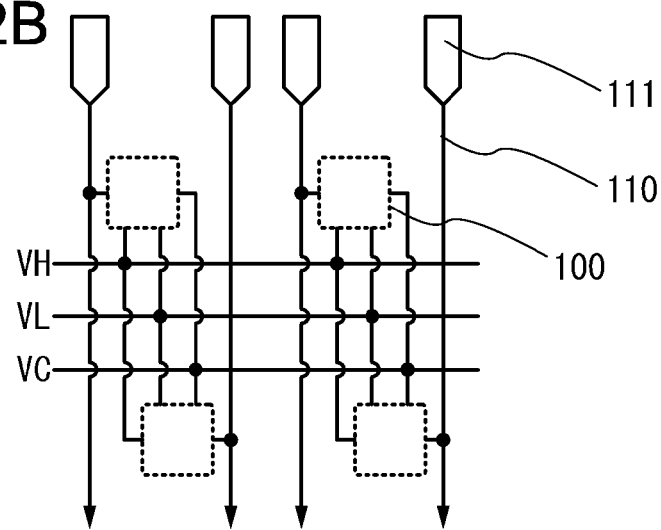

The following describes the case where a plurality of input lines are electrically connected to the above-described protection circuit, with reference to FIGS. 2A and 2B.

FIG. 2A illustrates the case where a plurality of protected wirings 110 are each electrically connected to a protection circuit 100.

Each protected wiring 110 includes an external input terminal 111 and transmits a signal input from the outside through the external input terminal 111. Each protected wiring 110 is electrically connected to the protection circuit 100.

The high potential line VH, the low potential line VL, and the common potential line VC are arranged so as to intersect the protected wirings 110. A plurality of protection circuits 100 electrically connected to the respective protected wirings 110 are each electrically connected to these lines.

As described above, when a plurality of protection circuits 100 are provided, these circuits can share the high potential line VH, the low potential line VL, and the common potential line VC to which the circuits are electrically connected.

In the configuration illustrated in FIG. 2B, two protection circuits 100 each electrically connected to corresponding one of a pair of protected wirings 110 are arranged between the pair of protected wirings 110 in a symmetrical way and in line along the direction in which the protected wirings 110 extend. Such arrangement enables high-density arrangement between the protected wirings 110, and thus is suitable for a semiconductor device that requires high-density arrangement of protected wirings, e.g., a very high-definition display device and a display device that requires a great number of input signals for a complicated driving method.

[Structure Example of Display Device]

Figure 3A:
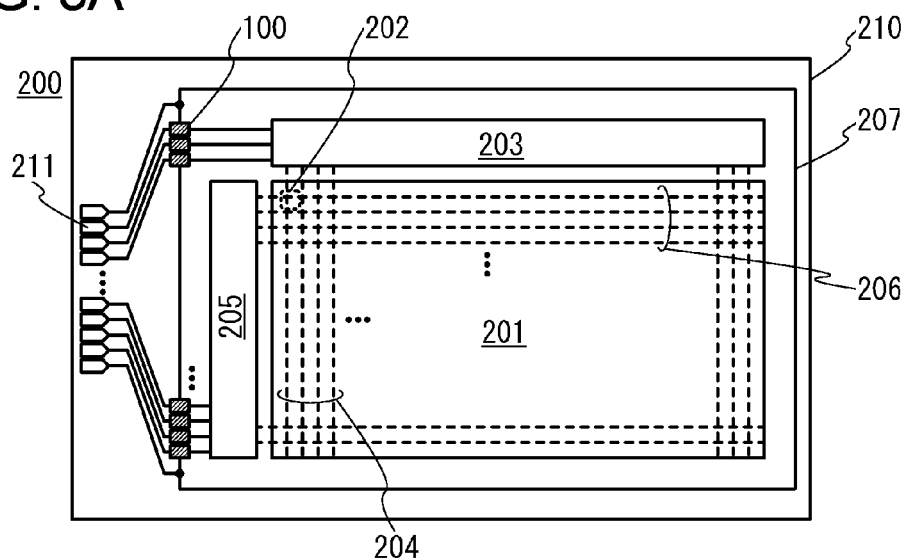
FIGS. 3A and 3B are diagrams illustrating examples of applications of the protection circuit according to one embodiment of the present invention.
Figure 3B:
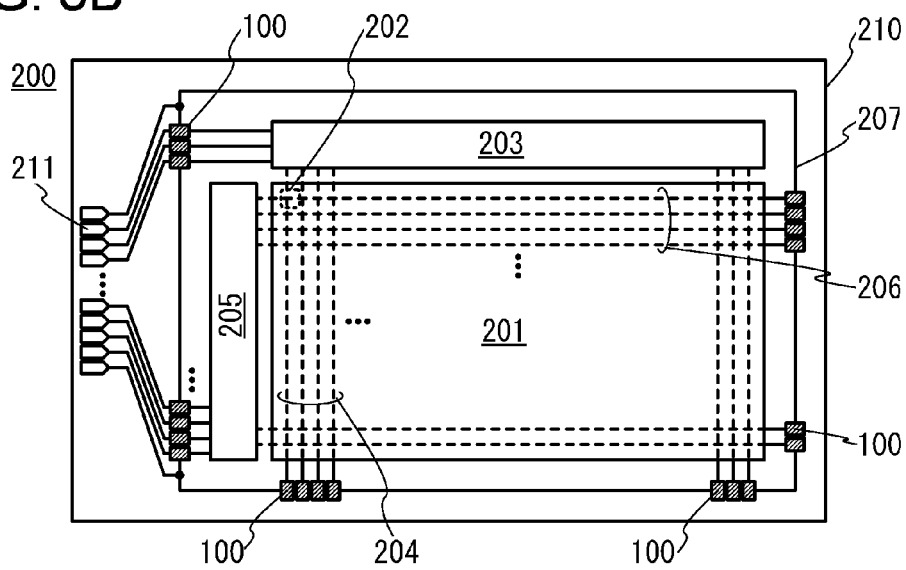

The following describes a structure example of a display device using a protection circuit according to one embodiment of the present invention, with reference to FIGS. 3A and 3B.

FIG. 3A is a schematic diagram of a display device 200 using a protection circuit 100. The display device 200 includes, over a substrate 210, a display portion 201 including a plurality of pixels 202, a scan line driver circuit 203, and a signal line driver circuit 205.

In the display portion 201, a plurality of scan lines 204 electrically connected to the scan line driver circuit 203 and a plurality of signal lines 206 electrically connected to the signal line driver circuit 205 are provided so as to intersect each other. One pixel is provided in a region where the scan line 204 intersects the signal line 206; thus, a plurality of pixels are arranged in a matrix.

The pixel 202 includes at least one selection transistor and one display element. A gate of the selection transistor is electrically connected to the scan line 204. One of a source and a drain of the selection transistor is electrically connected to the signal line 206. The on/off state of the selection transistor is controlled by signals input to the scan line 204 and the signal line 206 to drive the pixel 202. The display element in the pixel 202 is a liquid crystal element, an organic EL element, an inorganic EL element, an electrophoretic element, a display element using a twist ball, an electron-emissive element, or the like. An embodiment below will describe in detail a structure example of a display device using an organic EL element or a liquid crystal element as a display element.

The display device 200 further includes a plurality of external input terminals 211 to which potential signals, such as a power supply potential and a reference potential, and signals for driving the pixel 202, such as a drive signal, are input from the outside. Each external input terminal 211 is electrically connected to the scan line driver circuit 203, the signal line driver circuit 205, or the like.

A wiring for electrically connecting the external input terminal 211 to the scan line driver circuit 203 or the signal line driver circuit 205 is electrically connected to the protection circuit 100. Therefore, even when a pulse potential due to ESD is applied through the external input terminal 211, application of the pulse potential to the scan line driver circuit 203 and the signal line driver circuit 205 is efficiently suppressed.

As illustrated in FIG. 3A, a common potential line 207 electrically connected to a second gate of a transistor in the protection circuit 100 is preferably provided so as to form a closed curve surrounding circuits forming the display device 200, such as the display portion 201, the scan line driver circuit 203, and the signal line driver circuit 205. Since the common potential line 207 is provided so as to surround circuits forming the display device 200, electrical noise input from the outside to the display portion 201, the scan line driver circuit 203, the signal line driver circuit 205, or a wiring for electrically connecting these through a surface of the substrate 210 can be reduced, so that degradation in display quality can be suppressed. Further, the influence of ESD inside the circuit in a process for fabricating the display device 200 can be efficiently suppressed.

Note that a "closed curve" here means a continuous curve with no endpoints. Further, here, a "curve" includes concepts of a straight line and a line segment in its broad sense. Therefore, the case where a plurality of line segments are included and every end point of the line segments overlaps with another end point, such as a periphery of a quadrangle, is also one mode of the closed curve. Further, a polygon, a circle, an ellipse, a shape in which a plurality of curves having different curvatures is continuously connected, a shape including a straight line and a curve, or the like is also one mode of the closed curve. Note that in the aforementioned mode, the common potential line 207 is provided so as to surround the display portion 201, the scan line driver circuit 203, and the signal line driver circuit 205; however, the invention is not limited to this mode. The common potential line 207 is provided along at least a part of circuits forming the display device 200, so that electrical noise can be reduced. The common potential line 207 is provided along one side of the display portion 201, for example. Further, the common potential line 207 is provided along one side of at least one of the scan line driver circuit 203 and the signal line driver circuit 205, for example.

Here, as illustrated in FIG. 3B, the protection circuit 100 can be electrically connected to not only a wiring electrically connected to the external input terminal 211 but also the scan line 204 or the signal line 206. It is preferable to electrically connect, in an outside region of the display portion 201, the protection circuit 100 to the scan line 204 or the signal line 206 because it efficiently suppresses the influence of ESD on elements forming the pixel 202 or the scan line driver circuit 203 and the signal line driver circuit 205 when a pulse potential due to ESD is directly applied from the outside to the scan line 204 or the signal line 206. In addition, although not illustrated, the protection circuit 100 electrically connected to the scan line 204 or the signal line 206 may be provided between the scan line driver circuit 203 and the display portion 201 and between the signal line driver circuit 205 and the display portion 201.

As described above, a display device using a protection circuit according to one embodiment of the present invention can be a highly reliable display device in which the influence of ESD is efficiently suppressed. Since the common potential line shared by the protection circuits surrounds circuits forming the display device, noise from the outside or the influence of ESD in the display device can be suppressed and the display device can exhibit high display quality and high reliability.

This embodiment can be implemented in combination with any of the other embodiments disclosed in this specification as appropriate.

(Embodiment 2)

This embodiment describes a specific structure example of the protection circuit described in Embodiment 1 with reference to FIGS. 4A and 4B and FIGS. 5A and 5B. Here, a protection circuit using a thin film transistor is described.

Figure 4A:
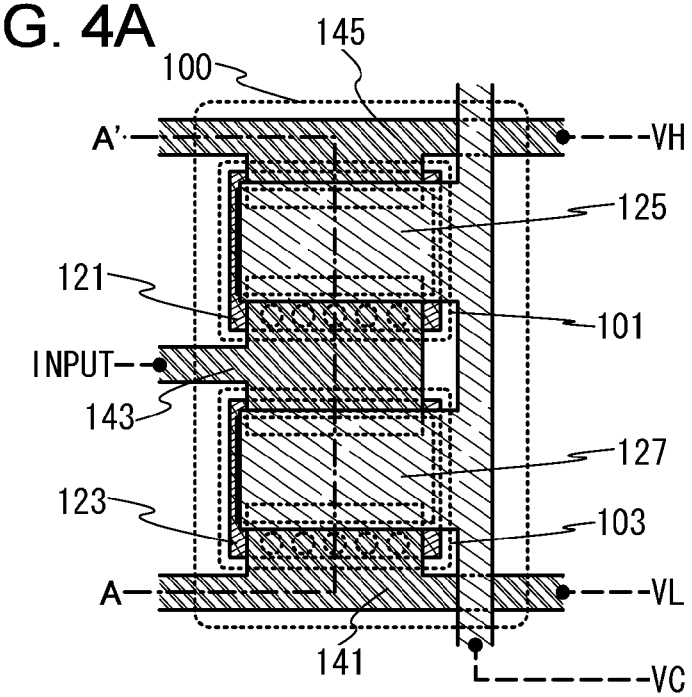
FIGS. 4A and 4B are diagrams illustrating a structure example of the protection circuit according to one embodiment of the present invention.
Figure 4B:
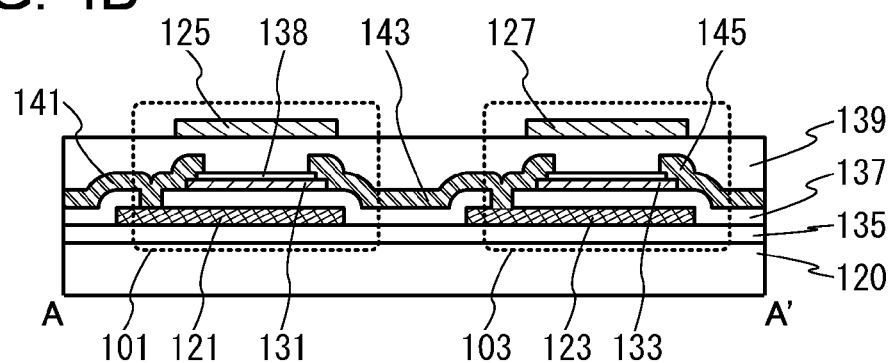

FIG. 4A is a schematic top view of a protection circuit 100 formed over the substrate 120. FIG. 4B is a cross-sectional schematic view along line A-A' in FIG. 4A.

The protection circuit 100 includes a transistor 101 and a transistor 103.

The transistor 101 includes a first gate electrode 121, an insulating layer 137, a semiconductor layer 131, an insulating layer 139, and a second gate electrode 125 sequentially stacked over the substrate 120. The transistor 101 further includes an electrode 141 and an electrode 143 which are in contact with the semiconductor layer 131.

The electrode 141 is electrically connected to the first gate electrode 121 through an opening provided in part of the insulating layer 137.

The transistor 103 includes a first gate electrode 123, the insulating layer 137, a semiconductor layer 133, the insulating layer 139, and a second gate electrode 127 sequentially stacked over the substrate 120. The transistor 103 further includes the electrode 143 and an electrode 145 which are in contact with the semiconductor layer 133.

The electrode 143 is electrically connected to the first gate electrode 123 through an opening provided in part of the insulating layer 137.

A part of the electrode 141 forms a low potential line VL, and a part of the electrode 145 forms a high potential line VH. The electrode 143 corresponds to the input portion of the protection circuit 100 (INPUT) and is electrically connected to a protected wiring (not illustrated). The second gate electrode 125 and the second gate electrode 127 are formed by the same conductive film, a part of which forms a common potential line VC.

FIG. 4B illustrates a structure in which an insulating layer 135 is formed over the substrate 120. The insulating layer 135 is provided to suppress diffusion of an impurity from the substrate 120. Note that the insulating layer 135 is not necessarily provided.

The substrate 120 may be any substrate which has an insulating surface, and may be made of glass, quartz, a metal whose surface is insulation processed, a semiconductor, or the like. An organic resin can also be used as long as it is resistant to a temperature of a process for fabricating the transistors.

The semiconductor layer 131 and the semiconductor layer 133 may be formed of a semiconductor material, such as silicon or germanium, or an oxide semiconductor containing at least one of indium, gallium, and zinc. There is no particular limitation on the crystallinity of a semiconductor used for the transistors; either an amorphous semiconductor or a crystalline semiconductor can be used.

The first gate electrodes, the second gate electrodes, the electrodes and the like may be a single layer or stack of, for example, a metal, such as molybdenum, magnesium, titanium, chromium, tantalum, tungsten, aluminum, copper, neodymium, or scandium, or an alloy containing any of these metals as its main component.

An insulating material for the insulating layer 135 and the insulating layer 137 may be, for example, an oxide, a nitride, an oxynitride, or a nitride oxide of a semiconductor such as silicon, aluminum, hathium, lanthanum or gallium, or a metal. An insulating material for the insulating layer 139 may be any of the above materials, or an organic insulator such as a siloxane-based material, acrylic, or polyimide.

For the transistors 101 and 103, insulating layers 138 are provided over the semiconductor layers 131 and 133. The insulating layers 138 are effective in protecting the semiconductor layers 131 and 133 from damage due to etching for processing a conductive film into the electrodes 141, 143, and 145. The insulating layers 138 are provided in contact with the semiconductor layers 131 and 133, so that contamination of surfaces of the semiconductor layers 131 and 133 facing the second gate electrodes is suppressed; thus, the transistors can exhibit stable electrical characteristics and high reliability. Note that the insulating layers 138 are not necessarily provided. When the insulating layers 138 are not provided, the process can be simplified.

With such a structure, the protection circuit 100 can be formed over the substrate 120.

In this case, if a pulse potential due to ESD is applied to the electrode 143 corresponding to the input portion of the protection circuit 100, capacitance formed between the semiconductor layer 131, in which a channel of the transistor 101 is formed, and the second gate electrode 125, and capacitance formed between the semiconductor layer 133, in which a channel of the transistor 103 is formed, and the second gate electrode 127 efficiently makes the slope of the rising edge of an input pulse potential, thereby reducing the arriving potential.

It is preferable to provide the second gate electrodes 125 and 127 such that they overlap with parts of the electrodes 141, 143 and 145 as illustrated in FIGS. 4A and 4B because it allows capacitance to be also formed between the electrodes, thereby efficiently making the slope of the rising edge of an input pulse potential gradual.

The functions of the first gate electrode and second gate electrode of each transistor in the protection circuit can interchange.

Figure 5A:
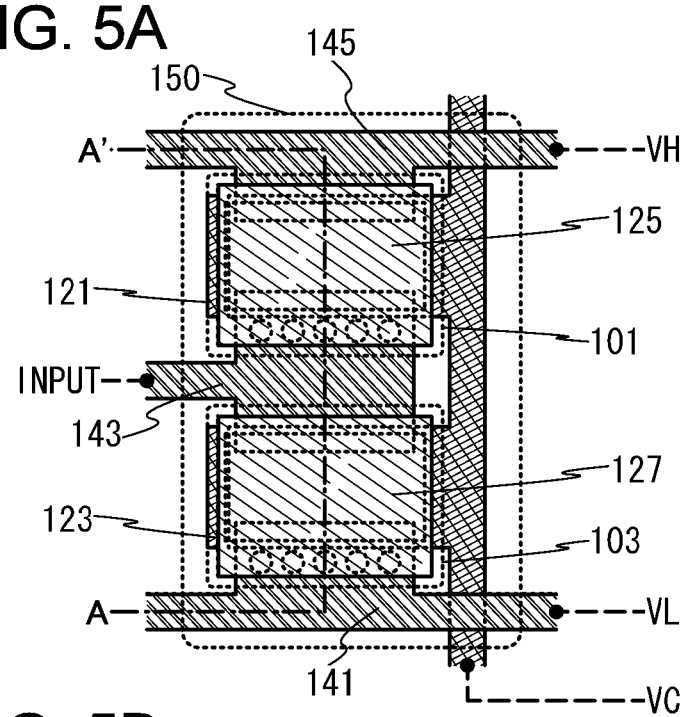
FIGS. 5A and 5B are diagrams illustrating a structure example of the protection circuit according to one embodiment of the present invention.
Figure 5B:
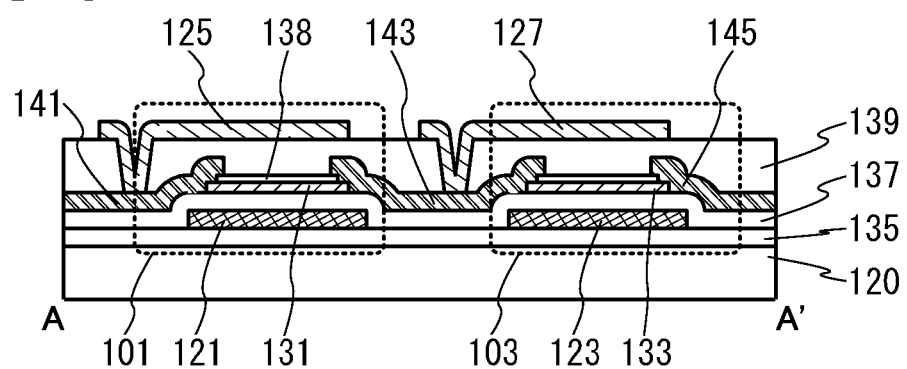

FIGS. 5A and 5B are schematic top and cross-sectional views of a protection circuit 150 having the same structure as the protection circuit 100 in FIGS. 4A and 4B except for the functions of the first gate electrode and second gate electrode, which are opposite to those in the protection circuit 100.

The protection circuit 150 is different from the protection circuit 100 in that the first gate electrode 121 of the transistor 101 and the first gate electrode 123 of the transistor 103 are formed by the same conductive film and a part of the conductive film forms the common potential line VC.

The second gate electrode 125 and the second gate electrode 127 are electrically connected to the electrode 141 and the electrode 143, respectively, through openings formed in the insulating layer 139.

In this case, capacitance between the semiconductor layer 131, in which a channel of the transistor 101 is formed, and the first gate electrode 121, and capacitance between the semiconductor layer 133, in which a channel of the transistor 103 is formed, and the first gate electrode 123 efficiently makes the slope of the rising edge of an input pulse potential due to ESD gradual.

Note that the structures of the transistors in the protection circuit 100 are not limited to the above; the transistors may have any structure as long as they each include at least two gate electrodes facing each other with a semiconductor layer sandwiched between the gate electrodes. For example, when an SOI substrate or a single crystal semiconductor substrate is used, a body electrode under a region where the transistor is provided is electrically connected to the common potential line.

This embodiment can be implemented in combination with any of the other embodiments disclosed in this specification and the like as appropriate.

(Embodiment 3)

Figure 6:
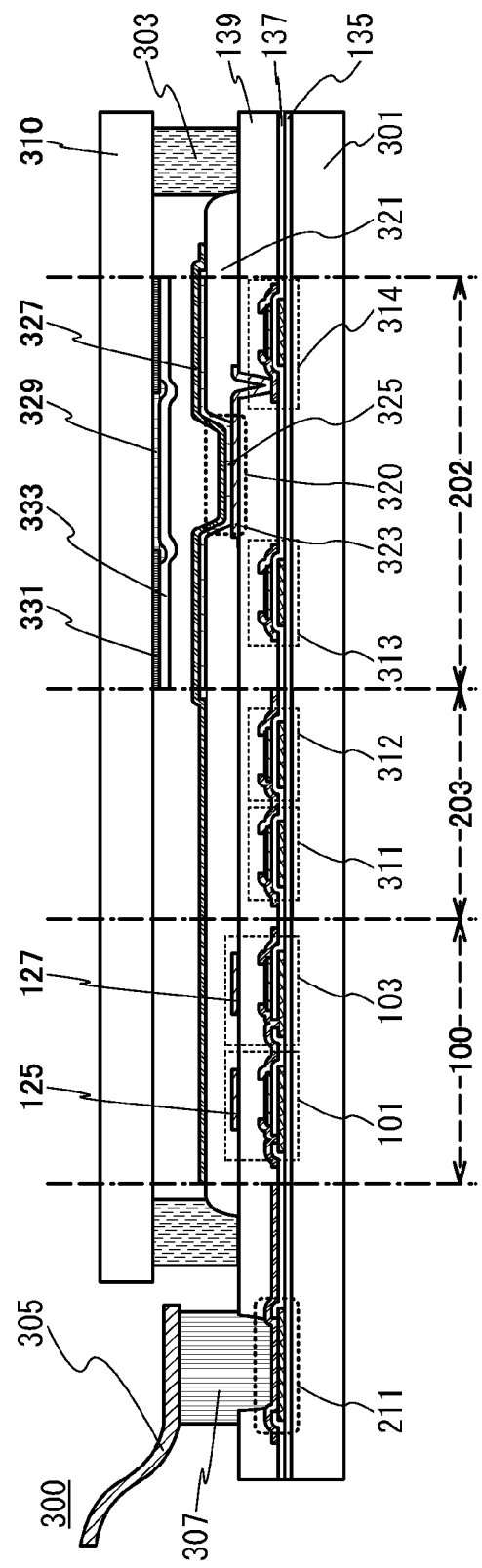
FIG. 6 is a diagram illustrating a display device according to one embodiment of the present invention.

This embodiment describes with reference to FIG. 6 a display device including an organic EL element, to which a protection circuit according to one embodiment of the present invention is applicable. In the description below, the description of the same content as in the above embodiments is sometimes omitted or simplified.

FIG. 6 is a schematic cross-sectional view of a display device 300 according to one embodiment of the present invention. Here, the structure of the display device in FIG. 3A described in Embodiment 1 is taken as an example. FIG. 6 is a schematic cross-sectional view of a region including an external input terminal 211, a protection circuit 100, a scan line driver circuit 203, and a pixel 202.

The display device 300 includes the protection circuit 100, the scan line driver circuit 203, and the pixel 202 over a first substrate 301. A second substrate 310 overlapping with the protection circuit 100, the scan line driver circuit 203, and the pixel 202 is provided so as to face the first substrate 301. The periphery of the first substrate 301 and the second substrate 310 is sealed with a sealant 303. The external input terminal 211 is provided in a region outside of the region sealed (hereinafter also called sealed region). A power supply potential or signals such as a drive signal can be input through the external input terminal 211.

The external input terminal 211 includes the same conductive film as that included in the transistors in the display device 300. In this structure example, the external input terminal 211 includes a stack of a conductive layer formed by the same conductive film as that used as the first gates of the transistors and a conductive layer formed by the same conductive film as that used as electrodes of the transistors. It is preferable that the external input terminal 211 include a stack of conductive layers because it increases mechanical strength against a step of attaching the FPC 305. A connector 307 is provided in contact with the external input terminal 211. An FPC 305 is electrically connected to the external input terminal 211 through the connector 307. The connector 307 can be formed using a paste-form or sheet-form material that is obtained by mixing metal particles to a thermosetting resin and exhibits anisotropic conductivity by thermocompression bonding. As the metal particles, particles in which two or more kinds of metals are layered, for example, Ni particles coated with Au are preferably used.

The scan line driver circuit 203 includes an NMOS circuit in which n-channel transistors, transistors 311 and 312, are used in combination, as an example. Note that the scan line driver circuit 203 is not limited to an NMOS circuit; various CMOS circuits in which an n-channel transistor and a p-channel transistor are used in combination or various PMOS circuits composed of p-channel transistors are applicable to the scan line driver circuit 203. Note that the same applies to the signal line driver circuit 205. Although this embodiment shows a driver-integrated structure in which the scan line driver circuit 203 and the signal line driver circuit 205 are formed over the substrate over which a display portion is formed, the scan line driver circuit 203 or the signal line driver circuit 205, or both may be formed over a substrate different from that over which the display portion is formed.

FIG. 6 illustrates a cross-sectional structure of one pixel 202 as an example of the display portion. The pixel 202 includes a switching transistor 313, a current control transistor 314, and a pixel electrode 323 that is electrically connected to an electrode (a source electrode or a drain electrode) of the current control transistor 314. An insulating layer 321 is formed to cover an end portion of the pixel electrode 323.

Note that the transistors included in the scan line driver circuit 203, the signal line driver circuit 205, and the pixel 202 may have the same structure as the transistors included in the protection circuit 100. Alternatively, the transistors may each have either a single gate electrode or two facing gate electrodes. When the transistor has two gate electrodes, its threshold voltage can be controlled by applying a potential to one of the gate electrodes.

A light-emitting element 320 is composed of the pixel electrode 323, an EL layer 325, and the common electrode 327. The structure, materials, and the like of the light-emitting element will be described in detail in an embodiment below.

Conductive layers are used as the pixel electrode 323 and the common electrode 327; a material that transmits light emitted from the EL layer 325 is used for an electrode through which light is emitted, and a material that reflects light emitted from the EL layer 325 is used for an electrode provided on the side opposite to the electrode through which light is emitted.

Examples of a light-transmitting material that can be used for the conductive layer through which light is emitted are indium oxide, indium tin oxide, indium zinc oxide, zinc oxide, zinc oxide to which gallium is added, and graphene. Other examples are a metal material such as gold, silver, platinum, magnesium, nickel, tungsten, chromium, molybdenum, iron, cobalt, copper, palladium, and titanium; an alloy containing any of these metal materials; and nitride of any of these metal materials (e.g., titanium nitride). In the case of using the metal material (or the nitride of the metal material), the conductive layer needs to have a thickness small enough to transmit light. Alternatively, a stack of any of the above materials can be used as the conductive layer. For example, a stack of an alloy of silver and magnesium and indium tin oxide is preferably used because the conductivity can be increased.

Examples of a light-reflecting material that can be used for the electrode on the side opposite to the electrode through which light is emitted are a metal material such as aluminum, gold, platinum, silver, nickel, tungsten, chromium, molybdenum, iron, cobalt, copper, and palladium; a metal containing any of these metal materials; an alloy to which lanthanum, neodymium, germanium, or the like is added; an alloy containing aluminum (aluminum alloy), such as an alloy of aluminum and titanium, an alloy of aluminum and nickel, and an alloy of aluminum and neodymium; and an alloy containing silver, such as an alloy of silver and copper and an alloy of silver and magnesium. An alloy of silver and copper is preferable because of its high heat resistance. Further, by stacking a metal film or a metal oxide film in contact with an aluminum alloy film, oxidation of the aluminum alloy film can be suppressed. Examples of a material for the metal film or the metal oxide film are titanium and titanium oxide. Alternatively, the conductive layer may be a stack of a film containing any of the above light-transmitting materials and a film containing any of the above metal materials. For example, the conductive layer can be a stack of silver and indium tin oxide or a stack of an alloy of silver and magnesium and indium tin oxide.

The insulating layer 321 is provided to cover the end portion of the pixel electrode 323. The insulating layer 321 is preferably formed so that its upper end portion or lower end portion has a curved surface with a curvature, in order to be adequately covered with the common electrode 327 which is formed over the insulating layer 321. For example, it is preferable that the upper end portion or the lower end portion of the insulating layer 321 have a curved surface with a radius of curvature of 0.2 μm to 3 μm. The insulating layer 321 can be formed using an organic compound such as a negative photosensitive resin or a positive photosensitive resin, or an inorganic compound such as silicon oxide or silicon oxynitride.

An insulating layer 135 is formed on a surface of the first substrate 301. The insulating layer 135 prevents diffusion of impurities included in the first substrate 301. The insulating layer 139, which is formed on and in contact with a source electrode and a drain electrode of each transistor, preferably prevents diffusion of impurities into a semiconductor included in the transistors. For the insulating layers 135 and 139, an inorganic insulating film that prevents diffusion of impurities can be used, and for example, a film of semiconductor oxide or metal oxide (e.g., silicon oxide or aluminum oxide) can be used. Alternatively, a stack of such an inorganic insulating material and an organic insulating material may be used. Note that the insulating layer 135 is not necessarily provided when not needed.

On the second substrate 310, a color filter 329 is provided to overlap with the light-emitting element 320. The color filter 329 is provided in order to control the color of light emitted from the light-emitting element 320. For example, in a full-color display device using white light-emitting elements, a plurality of pixels provided with color filters of different colors are used. In that case, the color filters may have three colors of R (red), G (green), and B (blue) or four colors (yellow (Y) in addition to RGB).

A black matrix 331 is provided between the adjacent color filters 329. The black matrix 331 shields a pixel from light emitted from the light-emitting elements 320 in adjacent pixels and prevents color mixture between the adjacent pixels. Here, the color filter 329 is provided so that its end portions overlap with the black matrix 331, whereby light leakage can be reduced. The black matrix 331 can be formed using a material that blocks light emitted from the light-emitting element 320, for example, a metal or an organic resin. Note that the black matrix 331 may be provided in a region other than the display portion 201, for example, in the protection circuit 100 or the scan line driver circuit 203.

An overcoat 333 is formed to cover the color filter 329 and the black matrix 331. The overcoat 333 is formed using a material that transmits light emitted from the light-emitting element 320, and can be an inorganic insulating film or an organic insulating film, for example. Note that the overcoat 333 is not necessarily provided when not needed.

Although the cross-sectional view in FIG. 6 illustrates only one light-emitting element 320, a plurality of light-emitting elements are arranged in a matrix in the display portion 201. For example, a display device capable of full-color display can be provided by including light-emitting elements that emit light of three colors (R, G, and B) in the display portion 201. Moreover, a display device capable of full-color display can be provided by using a combination of color filters and a light-emitting element including an EL layer that emits white light, which is exemplified in Embodiment 3. The light-emitting element can have any of a top emission structure, a bottom emission structure, and a dual emission structure. When a color filter is used in a bottom emission structure, the color filter is provided on the side from which light is extracted.

The first substrate 301 and the second substrate 310 are bonded to each other at the outer edge portion of the second substrate 310 by using the sealant 303. Examples of the sealant 303 are organic resins such as thermosetting resin and photocurable resin and low-melting-point glass (also referred to as glass frit). A drying agent may be contained in the sealant 303. For example, a substance that absorbs moisture by chemical adsorption, such as oxide of an alkaline earth metal (e.g., calcium oxide or barium oxide), can be used. Alternatively, a substance that adsorbs moisture by physical adsorption, such as zeolite or silica gel, may be used as the drying agent. The sealant 303 preferably contains a drying agent because impurities such as moisture in the sealed region can be reduced and the reliability of the light-emitting element 320 can be increased.

The light-emitting element 320 is provided in the sealed region surrounded by the first substrate 301, the second substrate 310, and the sealant 303. The sealed region may be filled with an inert gas such as a rare gas or a nitrogen gas a solid such as organic resin, or a viscous material such as a gel, or may be in a reduced pressure atmosphere. The amount of impurities such as water and oxygen in the sealed region is preferably small even if the sealed region is filled with a gas, a solid, or a gel or is in a reduced pressure atmosphere, because the reliability of the light-emitting element is increased.

The protection circuit 100 may have the structure described in Embodiment 2.

As illustrated in FIG. 6, the second gate electrodes (the second gate electrodes 125 and 127) in the protection circuit 100 are preferably formed by the same conductive film as the pixel electrode 323 of the light-emitting element 320. If formed by the same conductive film, these electrodes can be formed concurrently during fabrication of the display device 300, which facilitates the process.

Figure 12:
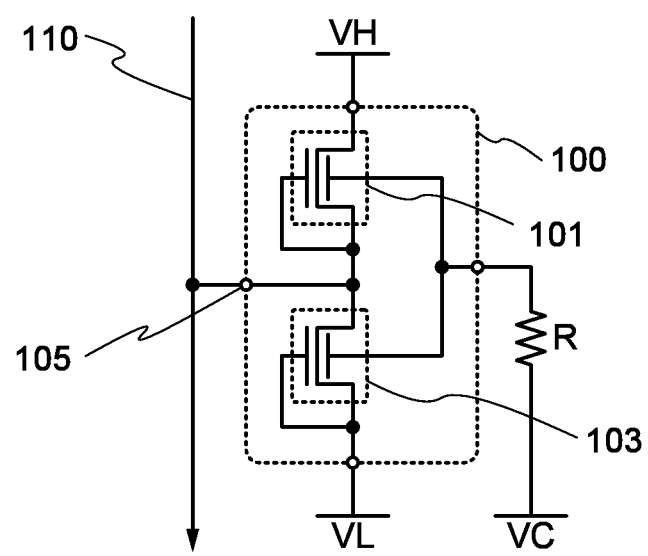
FIG. 12 is a diagram illustrating a protection circuit according to one embodiment of the present invention.

When the pixel electrode 323 and the second gate electrodes are formed by the same conductive film, a significant amount of resistance R may be given to the common potential line VC as illustrated in FIG. 12 depending on the conductive material of the conductive film. In this case, the resistance R serves as protection resistance that protects the common potential line VC from a potential due to ESD directly applied to the common potential line VC. This produces protective effect without providing an additional protection capacitor. This protective effect is particularly significant when a light-transmitting conductive film of indium tin oxide or the like is used, for example, as a conductive film forming the pixel electrode 323.

As described above, when the display device described in this embodiment uses a protection circuit according to one embodiment of the present invention, the influence of ESD in the display device can be efficiently reduced and the display device can exhibit very high reliability.

This embodiment can be implemented in combination with any of the other embodiments disclosed in this specification and the like as appropriate.

(Embodiment 4)

This embodiment describes a structure example of a display device including a liquid crystal element and using a protection circuit according to one embodiment of the present invention with reference to FIGS. 7A and 7B. In the description below, the description of the same content as in the above embodiments is sometimes omitted or simplified.

FIG. 7A is a schematic cross-sectional view of a display device 350 including a liquid crystal element in which an electric field is generated horizontally with respect to a substrate surface. The display device 350 in FIG. 7A differs from the display device in Embodiment 3 mainly in that each pixels 202 includes one transistor and that a liquid crystal element is used as a display element.

The pixel 202 includes at least one switching transistor 351. An electrode (a source electrode or a drain electrode) of the transistor 351 is electrically connected to a comb-shaped pixel electrode 353 provided over the insulating layer 139. A comb-shaped common electrode 355 is provided on the same plane as the pixel electrode 353.

It is preferable that the pixel electrode 353 or the common electrode 355 be formed of a light-transmitting conductive material because it increases aperture ratio.

Although the pixel electrode 353 and the common electrode 355 are represented by different hatching patterns in FIG. 7A for clarification, they may be formed by the same conductive film. In this embodiment, the pixel electrode 353 and the common electrode 355 are placed on the same plane; alternatively, these electrodes may be provided on different planes with an insulating layer placed therebetween. In that case, a region where one electrode and the other electrode provided thereover do not overlap with each other is provided. When the pixel electrode 353 and the common electrode 355 are placed on different planes, one of the electrodes which is placed under the other may have a plane shape instead of a comb shape.

Under a sealed region, a liquid crystal 357 is sealed at least between the second substrate 310 and the pixel electrode 353 and between the second substrate 310 and the common electrode 355. Here, a liquid crystal element 360 is composed of the pixel electrode 353, the common electrode 355, and the liquid crystal 357.

The display device 350 displays an image in the following way: an electric field is generated in the horizontal direction with respect to the substrate surface by application of voltage between the pixel electrode 353 and the common electrode 355, alignment of the liquid crystal 357 is controlled by the electric field, and polarization of light from a backlight provided outside the display device 350 is controlled in each pixel.

An alignment film that controls alignment of the liquid crystal 357 may be provided on a surface in contact with the liquid crystal 357. A light-transmitting material is used for the alignment film. A polarizer may be provided on any of surfaces of the first substrate 301 and the second substrate 310.

Moreover, a light guide plate may be used so that light from the backlight enters through a side surface of the display device 350.

The color filter 329 is formed on a portion of the second substrate 310 which overlaps with the liquid crystal element 360. By using the color filter 329, a full-color image can be displayed with a backlight that emits white light. With the use of a plurality of light-emitting diodes (LEDs) as a backlight, a time-division display method (a field-sequential driving method) can be employed. In the case of employing a time-division display method, the aperture ratio or the number of pixels per unit area can be increased because neither color filters nor subpixels from which light of red (R), green (G), or blue (B), for example, is obtained are needed.

As the liquid crystal 357, a thermotropic liquid crystal, a low molecular weight liquid crystal, a polymer liquid crystal, a ferroelectric liquid crystal, an anti-ferroelectric liquid crystal, or the like can be used. Moreover, a liquid crystal exhibiting a blue phase is preferably used because an alignment film is not necessary and the viewing angle is wide.

The second gate electrodes (the second gate electrodes 125 and 127) of the transistors in the protection circuit 100 provided in the display device 350 are preferably formed by the same conductive film as one of the electrodes included in the liquid crystal element 360, the pixel electrode 353 or the common electrode 355. When they are formed by the same conductive film and thus fabricated concurrently, the protection circuit 100 can be formed concurrently with the pixel and the like by a conventional fabrication method without complicating the fabrication process.

FIG. 7B is a schematic cross-sectional view of a display device 370 including a liquid crystal element in which an electric field is generated vertically with respect to a substrate surface. The display device 370 differs from the display device 350 mainly in that a pixel electrode 373 is provided to face the common electrode 375.

In the pixel 202, the pixel electrode 373 provided over the insulating layer 139 is electrically connected to the electrode of the switching transistor 351. The common electrode 375 is provided over the second substrate 310 to face the pixel electrode 373.

In a sealed region, the liquid crystal 377 is sealed at least between the pixel electrode 373 and the common electrode 375. Here, a liquid crystal element 380 is composed of the pixel electrode 373, the common electrode 375, and the liquid crystal 377. A spacer for adjusting a gap between the first substrate 301 and the second substrate 310 may be sealed in a region where the liquid crystal 377 is sealed.

The display device 370 displays an image in the following way: an electric field is generated in the vertical direction with respect to the substrate by application of voltage between the pixel electrode 373 and the common electrode 375, alignment of the liquid crystal 377 is controlled by the electric field, and polarization of light from a backlight provided outside the display device 370 is controlled in each pixel.

In the sealed region, the common electrode 375 is electrically connected, through a connector 379, to a connection wiring formed over the first substrate 301.

The connector 379 can be formed using, for example, an organic resin in which resin material beads coated with a conductive film are dispersed. The connector 379 functions as an anisotropic conductor, with which the common electrode 375 and the connection wiring can be electrically connected to each other. For the conductor that coats the beads, a metal is preferably used, and in particular a metal material that is chemically stable and has low resistance, such as gold (Au), is preferably used. This is because the reliability is increased and the resistivity and contact resistance can be reduced.

The second gate electrodes (the second gate electrodes 125 and 127) of the transistors in the protection circuit 100 provided in the display device 370 are preferably formed by the same conductive layer as the pixel electrode 373 in the liquid crystal element 380.

The display device described in this embodiment which includes the liquid crystal element includes a protection circuit according to one embodiment of the present invention. Therefore, the influence of ESD in the display device can be efficiently reduced and the display device can exhibit very high reliability.

This embodiment can be implemented in combination with any of the other embodiments disclosed in this specification as appropriate.

(Embodiment 5)

In this embodiment, EL layers that can be applied to the display device according to one embodiment of the present invention will be described with reference to FIGS. 8A to 8C.

An EL layer 711 illustrated in FIG. 8A is provided between a first electrode 712 and a second electrode 713. The first electrode 712 and the second electrode 713 can have a structure similar to that of the common electrode or the pixel electrode in the above embodiment.

A light-emitting element including the EL layer 711 exemplified in this embodiment can be used in any of the display devices in the above embodiment.

The EL layer 711 includes at least a light-emitting layer containing a light-emitting organic compound. In addition, the EL layer 711 can have a layered structure in which a layer containing a substance with a high electron-transport property, a layer containing a substance with a high hole-transport property, a layer containing a substance with a high electron-injection property, a layer containing a substance with a high hole-injection property, a layer containing a bipolar substance (a substance having a high electron-transport property and a high hole-transport property), and the like are combined as appropriate. In this embodiment, in the EL layer 711, a hole-injection layer 701, a hole-transport layer 702, a layer 703 containing a light-emitting organic compound, an electron-transport layer 704, and an electron-injection layer 705 are stacked in this order from the first electrode 712 side. Note that the stacking order may be inversed.

A method for fabricating the light-emitting element illustrated in FIG. 8A will be described.

The hole-injection layer 701 is a layer containing a substance with a high hole-injection property. Examples of the substance with a high hole-injection property are metal oxides such as molybdenum oxide, titanium oxide, vanadium oxide, rhenium oxide, ruthenium oxide, chromium oxide, zirconium oxide, hafnium oxide, tantalum oxide, silver oxide, tungsten oxide, and manganese oxide; and phthalocyanine-based compounds such as phthalocyanine ($H_2Pc$) and copper(II) phthalocyanine (CuPc).

Alternatively, aromatic amine compounds which are low molecular organic compounds can be used, for example.

Further alternatively, any of high molecular compounds (e.g., oligomers, dendrimers, or polymers) can be used. A high molecular compound to which acid is added can also be used.

In particular, for the hole-injection layer 701, it is preferable to use a composite material in which an acceptor substance is added to an organic compound having a high hole-transport property. With the use of the composite material in which an acceptor substance is added to a substance with a high hole-transport property, hole injection from the first electrode 712 is facilitated, which leads to a reduction in the drive voltage of a light-emitting element. Such a composite material can be formed by co-evaporation of a substance with a high hole-transport property and an acceptor substance (electron acceptor). The hole-injection layer 701 is formed using the composite material, whereby hole injection from the first electrode 712 to the EL layer 711 is facilitated.

As the organic compound used for the composite material, various kinds of compounds such as aromatic amine compounds, carbazole derivatives, aromatic hydrocarbon, and high molecular compounds (e.g., oligomers, dendrimers, and polymers) can be used. The organic compound used for the composite material is preferably an organic compound having a high hole-transport property. Specifically, a substance with a hole mobility of $10^{-6}$ cm$^2$/Vs or higher is preferably used. Note that any other substance may also be used as long as its hole-transport property is higher than its electron-transport property.

As the organic compound which can be used for the composite material, an aromatic amine compound, a carbazole derivative, an aromatic hydrocarbon compound having a high hole mobility can be used.

Examples of the acceptor substance are organic compounds, transition metal oxides, and oxides of metals belonging to Groups 4 to 8 in the periodic table. Specifically, vanadium oxide, niobium oxide, tantalum oxide, chromium oxide, molybdenum oxide, tungsten oxide, manganese oxide, and rhenium oxide are preferable since their electron-accepting properties are high. Among these, molybdenum oxide is particularly preferable since it is stable in the air and its hygroscopic property is low and is easily treated.

The composite material may be formed using a high molecular compound and the above electron acceptor to be used for the hole-injection layer 701.

The hole-transport layer 702 is a layer containing a substance with a high hole-transport property. Examples of the substance with a high hole-transport property are aromatic amine compounds, most of which have a hole mobility of $10^{-6}$ cm$^2$/Vs or higher. Note that any other substance may also be used as long as its hole-transport property is higher than its electron-transport property. The layer containing a substance with a high hole-transport property is not limited to a single layer and may be a stack of two or more layers containing any of the above substances.

A carbazole derivative, an anthracene derivative, or a high molecular compound having a high hole-transport property may also be used for the hole-transport layer 702.

For the layer 703 containing a light-emitting organic compound, a fluorescent compound which exhibits fluorescence or a phosphorescent compound which exhibits phosphorescence can be used.

Note that the layer 703 containing a light-emitting organic compound may have a structure in which a light-emitting organic compound (guest material) is dispersed in another substance (host material). As a host material, various kinds of materials can be used, and it is preferable to use a substance that has a lowest unoccupied molecular orbital level (LUMO level) higher than that of the light-emitting substance and has a highest occupied molecular orbital level (HOMO level) lower than that of the light-emitting substance.

Alternatively, plural kinds of materials can be used as the host material. For example, a substance that suppresses crystallization may be added in order to suppress crystallization. Moreover, a different kind of substance may be added in order to efficiently transfer energy to the guest material.

With a structure in which a guest material is dispersed in a host material, crystallization of the layer 703 containing a light-emitting organic compound can be suppressed. Further, concentration quenching due to high concentration of the guest material can be suppressed.

For the layer 703 containing a light-emitting organic compound, a high molecular compound can be used.

When a plurality of layers each containing a light-emitting organic compound are provided and the emission colors of the layers are made different, light emission of a desired color can be obtained from the light-emitting element as a whole. For example, in a light-emitting element including two layers each containing a light-emitting organic compound, the emission color of a first layer containing a light-emitting organic compound and the emission color of a second layer containing a light-emitting organic compound are made complementary, so that the light-emitting element as a whole can emit white light. Note that "complementary colors" refer to colors that can produce an achromatic color when mixed. That is, a mixture of light emitted from substances that emit light of complementary colors produces white light. This can be applied to a light-emitting element including three or more layers each containing a light-emitting organic compound.

The electron-transport layer 704 is a layer containing a substance with a high electron-transport property. The substance with a high electron-transport property is mainly one that has an electron mobility of $10^{-6}$ cm$^2$/Vs or higher. The electron-transport layer is not limited to a single layer and may be a stack of two or more layers made of the aforementioned substances.

The electron-injection layer 705 is a layer containing a substance with a high electron-injection property. For the electron-injection layer 705, an alkali metal, an alkaline earth metal, or a compound thereof (e.g., lithium, cesium, calcium, lithium fluoride, cesium fluoride, calcium fluoride, or lithium oxide) can be used. A rare earth metal compound such as erbium fluoride can also be used. Any of the above substances for forming the electron-transport layer 704 can also be used.

Note that the hole-injection layer 701, the hole-transport layer 702, the layer 703 containing a light-emitting organic compound, the electron-transport layer 704, and the electron-injection layer 705 which are described above can each be formed by an evaporation method (e.g., a vacuum evaporation method), an ink-jet method, a coating method, or the like.

As illustrated in FIG. 8B, a plurality of EL layers may be stacked between the first electrode 712 and the second electrode 713. In that case, a charge generation layer 803 is preferably provided between a first EL layer 800 and a second EL layer 801 which are stacked. The charge generation layer 803 can be formed by using the above-mentioned composite material. Alternatively, the charge generation layer 803 may have a layered structure of a layer containing the composite material and a layer containing another material. In that case, as the layer including another material, a layer including a substance with an electron-donating property (donor substance) and a substance with a high electron-transport property, a layer formed using a transparent conductive film, or the like can be used. A light-emitting element having such a structure is unlikely to suffer the problem of energy transfer, quenching, or the like and gives wider choice of materials, thereby easily having both high light emission efficiency and a long lifetime. Moreover, it is easy to obtain a light-emitting element producing phosphorescence from one EL layer and fluorescence from the other EL layer. This structure can be combined with the above-mentioned structure of the EL layer.

When the emission colors of EL layers are made different, a light-emitting element as a whole can provide light emission of a desired color. For example, when a light-emitting element including two EL layers is formed so that the emission color of the first EL layer and the emission color of the second EL layer are complementary colors, the light-emitting element as a whole can emit white light. This can be applied to a light-emitting element including three or more EL layers.

In order to obtain white light with high color rendering properties, the emission spectrum needs to cover the whole visible light range and thus a light-emitting element in which three or more EL layers are stacked is preferably used. For example, such a light-emitting element can be formed by stacking EL layers emitting light of the respective colors of red, blue, and green. In this manner, the color rendering properties of a light-emitting element can be improved by stacking EL layers of different three or more colors.

An optical adjustment layer may be formed between the first electrode 712 and the second electrode 713. The optical adjustment layer adjusts the optical distance between a reflective electrode and a light-transmitting electrode. With the optical adjustment layer, light with wavelengths in a specific range can be enhanced and as a result, the color tone can be adjusted.

As illustrated in FIG. 8C, the EL layer 711 may include the hole-injection layer 701, the hole-transport layer 702, the layer 703 containing a light-emitting organic compound, the electron-transport layer 704, an electron-injection buffer layer 706, an electron-relay layer 707, and a composite material layer 708 that is in contact with the second electrode 713, between the first electrode 712 and the second electrode 713.

The composite material layer 708 which is in contact with the second electrode 713 is preferably provided, in which case damage caused to the EL layer 711 particularly when the second electrode 713 is formed by sputtering can be reduced. The composite material layer 708 can be formed using the above-described composite material in which an acceptor substance is mixed with an organic compound with a high hole-transport property.

Further, by providing the electron-injection buffer layer 706, an injection barrier between the composite material layer 708 and the electron-transport layer 704 can be reduced; thus, electrons generated in the composite material layer 708 can be easily injected to the electron-transport layer 704.

The electron-injection buffer layer 706 can be formed using a substance with a high electron-injection property, for example, an alkali metal, an alkaline earth metal, a rare earth metal, or a compound of the above metal (e.g., an alkali metal compound (e.g., oxide such as lithium oxide, halide, or carbonate such as lithium carbonate or cesium carbonate), an alkaline earth metal compound (e.g., oxide, halide, or carbonate), or a rare earth metal compound (e.g., oxide, halide, or carbonate)).

When the electron-injection buffer layer 706 contains a substance with a high electron-transport property and a donor substance, the donor substance is preferably added so that the mass ratio of the donor substance to the substance with a high electron-transport property is from 0.001:1 to 0.1:1. As the donor substance, any of the following can be used, for example: an organic compound such as tetrathianaphthacene (TTN), nickelocene, and decamethylnickelocene, in addition to an alkali metal, an alkaline earth metal, a rare earth metal, and a compound of the above metal (e.g., an alkali metal compound (e.g., oxide such as lithium oxide, halide, and carbonate such as lithium carbonate and cesium carbonate), an alkaline earth metal compound (e.g., oxide, halide, and carbonate), and a rare earth metal compound (e.g., oxide, halide, and carbonate)). Note that as the substance with a high electron-transport property, a material similar to the material for the electron-transport layer 704 described above can be used.

Furthermore, the electron-relay layer 707 is preferably formed between the electron-injection buffer layer 706 and the composite material layer 708. The electron-relay layer 707 is not necessarily provided; by providing the electron-relay layer 707 with a high electron-transport property, electrons can be rapidly transported to the electron-injection buffer layer 706.

In the structure in which the electron-relay layer 707 is sandwiched between the composite material layer 708 and the electron-injection buffer layer 706, the acceptor substance contained in the composite material layer 708 and the donor substance contained in the electron-injection buffer layer 706 are less likely to interact with each other, and thus their functions hardly interfere with each other. Accordingly, the increase in the drive voltage can be prevented.

The electron-relay layer 707 contains a substance with a high electron-transport property and is formed so that the LUMO level of the substance with a high electron-transport property is located between the LUMO level of the acceptor substance contained in the composite material layer 708 and the LUMO level of the substance with a high electron-transport property contained in the electron-transport layer 704. In the case where the electron-relay layer 707 contains a donor substance, the donor level of the donor substance is controlled to be located between the LUMO level of the acceptor substance in the composite material layer 708 and the LUMO level of the substance with a high electron-transport property contained in the electron-transport layer 704. As a specific value of the energy level, the LUMO level of the substance with a high electron-transport property contained in the electron-relay layer 707 is preferably −5.0 eV or more, further preferably from −5.0 eV to −3.0 eV.

As the substance with a high electron-transport property contained in the electron-relay layer 707, a phthalocyanine-based material or a metal complex having a metal-oxygen bond and an aromatic ligand is preferably used.

As the metal complex having a metal-oxygen bond and an aromatic ligand, which is contained in the electron-relay layer 707, a metal complex having a metal-oxygen double bond is preferably used. Since the metal-oxygen double bond has an acceptor property (a property of easily accepting electrons), electrons can be transferred (donated and accepted) more easily. Further, the metal complex having a metal-oxygen double bond is considered stable. Thus, the use of the metal complex having the metal-oxygen double bond makes it possible to drive the light-emitting element more stably at low voltage.

As a metal complex having a metal-oxygen bond and an aromatic ligand, a phthalocyanine-based material is preferable. A substance in which a metal-oxygen double bond is more likely to act on another molecular in terms of a molecular structure is particularly preferable because it has a high acceptor property.

Note that the phthalocyanine-based material preferably has a phenoxy group. Specifically, a phthalocyanine derivative having a phenoxy group, such as PhO-VOPc, is preferable. Since a phthalocyanine derivative having a phenoxy group is soluble in a solvent, it has an advantage of being easily handled during formation of the light-emitting element and an advantage of facilitating maintenance of an apparatus used for forming a film.

The electron-relay layer 707 may further contain a donor substance. Examples of the donor substance are an organic compound such as tetrathianaphthacene (TTN), nickelocene, and decamethylnickelocene, in addition to an alkali metal, an alkaline earth metal, a rare earth metal, and a compound of the above metal (e.g., an alkali metal compound (e.g., oxide such as lithium oxide, halide, and carbonate such as lithium carbonate and cesium carbonate), an alkaline earth metal compound (e.g., oxide, halide, and carbonate), and a rare earth metal compound (e.g., oxide, halide, and carbonate)). When such a donor substance is contained in the electron-relay layer 707, electrons can be transferred easily and the light-emitting element can be driven at lower voltage.

In the case where a donor substance is contained in the electron-relay layer 707, in addition to the materials described above, a substance having a LUMO level higher than the acceptor level of the acceptor substance contained in the composite material layer 708 can be used as the substance with a high electron-transport property. Specifically, the LUMO level of the substance is preferably −5.0 eV or more, further preferably from −5.0 eV to −3.0 eV. Examples of such a substance are a perylene derivative and a nitrogen-containing condensed aromatic compound. Note that a nitrogen-containing condensed aromatic compound is preferably used for the electron-relay layer 707 because of its stability.

Note that in the case where a donor substance is contained in the electron-relay layer 707, the electron-relay layer 707 can be formed by a method such as co-evaporation of the substance with a high electron-transport property and the donor substance.

The hole-injection layer 701, the hole-transport layer 702, the layer 703 containing a light-emitting organic compound, and the electron-transport layer 704 can each be formed using any of the above-described materials.

In the above manner, the EL layer 711 in this embodiment can be formed.

This embodiment can be implemented in combination with any of the other embodiments disclosed in this specification as appropriate.

(Embodiment 6)

In this embodiment, a liquid crystal element that can be applied to the display device according to one embodiment of the present invention will be described with reference to FIG. 9.

Figure 9:
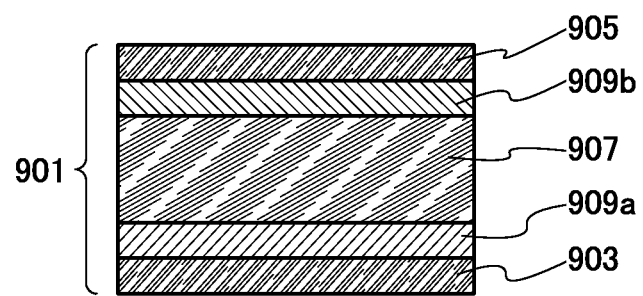
FIG. 9 is a diagram illustrating a liquid crystal element according to one embodiment of the present invention.

In a liquid crystal element 901 illustrated in FIG. 9, a liquid crystal 907 is sandwiched between a first electrode 903 and a second electrode 905. An alignment film 909a and an alignment film 909b are provided in contact with the liquid crystal 907 on the first electrode 903 side and the second electrode 905 side, respectively.

For the first electrode 903 and the second electrode 905, a light-transmitting conductive material can be used. Examples of the light-transmitting conductive material are indium oxide containing tungsten oxide, indium zinc oxide containing tungsten oxide, indium oxide containing titanium oxide, indium tin oxide containing titanium oxide, indium tin oxide, indium zinc oxide, and indium tin oxide to which silicon oxide is added. Alternatively, a conductive composition containing a conductive macromolecule (also referred to as a conductive polymer) can be used.

In order to fabricate a liquid crystal element for a transmissive liquid crystal display device, a light-transmitting conductive material is used for the first electrode 903 and the second electrode 905 as described above; whereas in order to fabricate a liquid crystal element for a reflective liquid crystal display device, a reflective conductive material is used for the electrode on the side opposite to a viewer. For example, a single layer of a metal such as titanium, molybdenum, aluminum, copper, tungsten, or tantalum; an alloy including any of the metals; or a stack including any of these metals and alloys can be used.

The alignment films 909a and 909b are provided to control the alignment of the liquid crystal 907. The alignment films 909a and 909b can be formed using an organic resin such as polyimide or polyvinyl alcohol or an inorganic material such as silicon oxide. Alignment treatment such as rubbing treatment is performed on the alignment films 909a and 909b so that liquid crystal molecules in contact with the alignment films 909a and 909b can be aligned at a certain pretilt angle. Note that when the alignment films 909a and 909b are formed using an inorganic material such as silicon oxide, the alignment films 909a and 909b having alignment characteristics can be formed by evaporation without rubbing treatment.

As the alignment films 909a and 909b, an alignment film with which the liquid crystal is aligned by ultraviolet light irradiation may be used. For such an alignment film, a photosensitive resin such as poly(vinyl cinnamate) (PVCi) may be used. When such an alignment film is employed, rubbing treatment is unnecessary; thus, electrostatic discharge damage caused by the rubbing treatment can be prevented and defects and damage of a liquid crystal display device can be reduced in the fabrication process.

As the liquid crystal 907, a known liquid crystal material such as a thermotropic liquid crystal, a low molecular weight liquid crystal, a polymer liquid crystal, a ferroelectric liquid crystal, or an anti-ferroelectric liquid crystal can be used.

Alternatively, a liquid crystal exhibiting a blue phase for which an alignment film is unnecessary may be used. A blue phase is one of liquid crystal phases, which is generated just before a cholesteric phase changes into an isotropic phase while temperature of cholesteric liquid crystal is increased. Since the blue phase appears only in a narrow temperature range, a liquid crystal composition in which 5 wt. % or more of a chiral agent is mixed is preferably used for the liquid crystal 907 in order to increase the temperature range. The liquid crystal composition that includes a liquid crystal exhibiting a blue phase and a chiral agent has a short response time of 1 ms or less and has optical isotropy, which makes the alignment process unneeded and the viewing angle dependence small.

When a liquid crystal exhibiting a blue phase is used, rubbing treatment on an alignment film is unnecessary; accordingly, electrostatic discharge damage caused by the rubbing treatment can be prevented and defects and damage of the liquid crystal display device can be reduced in the fabrication process. Thus, the productivity of the liquid crystal display device can be increased. In particular, when a liquid crystal display device is fabricated using transistors, electrical characteristics of the transistors might vary significantly and deviate from the design range by the influence of static electricity. Therefore, it is highly effective to use a blue phase liquid crystal material for a liquid crystal display device including transistors.

Next, the operation mode of the liquid crystal element 901 will be described. Here, a twisted nematic (TN) mode is described as an example.

In the TN mode liquid crystal element 901, liquid crystal molecules in the liquid crystal 907 are twisted 90° between the pair of electrodes when no electric field is applied. Thus, when linear polarized light enters the liquid crystal element 901 with no electric field applied, light whose polarization component is shifted by 90° is extracted.

When a proper voltage is applied between the pair of electrodes, the liquid crystal molecules in the liquid crystal 907 are aligned in the electric field direction. Accordingly, light entering the liquid crystal element 901 with voltage applied is extracted without a change in the polarization component.

Polarizers are provided on the light incident side and the light emission side of the liquid crystal element 901. In the case where these two polarizers are arranged in crossed Nicols (i.e., their polarizing axes are orthogonal to each other), a normally white mode is obtained, that is, light passes through the liquid crystal when no electric field is applied. On the other hand, in the case where the polarizers are arranged in parallel Nicols (i.e., their polarizing axes are parallel to each other), a normally black mode is obtained, that is, light is blocked when no electric field is applied.

The amount of light extracted through the polarizers can be adjusted by adjusting a voltage applied between the pair of electrodes of the liquid crystal element 901.

Although a TN mode liquid crystal element is described in this embodiment, the liquid crystal element can employ another operation mode such as a vertical alignment (VA) mode, a multi-domain vertical alignment (MVA) mode, an in-plane switching (IPS) mode, a continuous pinwheel alignment (CPA) mode, or a patterned vertical alignment (PVA) mode.

This embodiment can be implemented in combination with any of the other embodiments disclosed in this specification as appropriate.

(Embodiment 7)

In this embodiment, electronic devices to which a protection circuit according to one embodiment of the present invention and a display device including the protection circuit can be applied will be described with reference to FIGS. 10A to 10D.

Examples of the electronic devices to which the display device is applied are television sets (also referred to as televisions or television devices), monitors of computers or the like, cameras such as digital cameras and digital video cameras, digital photo frames, mobile phones (also referred to as cell phones or cellular phones), portable game consoles, personal digital assistants, audio reproducing devices, and large-sized game machines such as pachinko machines. Specific examples of these electronic devices are illustrated in FIGS. 10A to 10D.

Figure 10A:
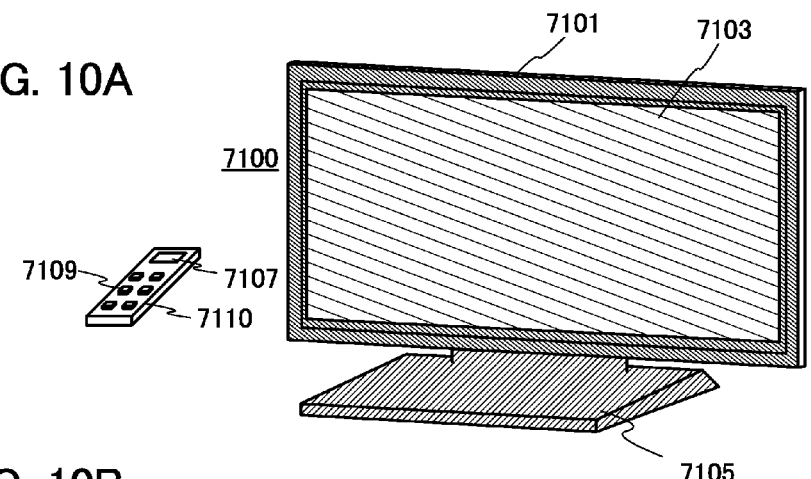
FIGS. 10A to 10D are diagrams each illustrating an electronic device according to one embodiment of the present invention.

FIG. 10A illustrates an example of a television set. In a television set 7100, a display portion 7103 is incorporated in a housing 7101. Images can be displayed on the display portion 7103, and the display device can be used for the display portion 7103. Here, the housing 7101 is supported by a stand 7105.

The television set 7100 can be operated by an operation switch of the housing 7101 or a separate remote controller 7110. With operation keys 7109 of the remote controller 7110, channels and volume can be controlled and images displayed on the display portion 7103 can be controlled. The remote controller 7110 may have a display portion 7107 for displaying data output from the remote controller 7110.

Note that the television set 7100 is provided with a receiver, a modem, and the like. A general television broadcast can be received with the receiver. When the television set 7100 is connected to a communication network with or without wires via the modem, one-way (from a sender to a receiver) or two-way (between a sender and a receiver or between receivers) information communication can be performed.

Figure 10B:
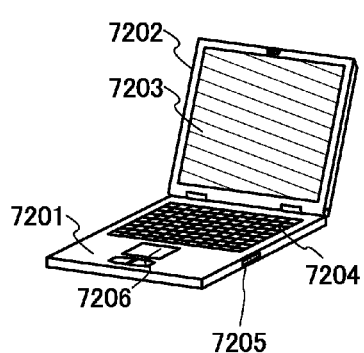

FIG. 10B illustrates a computer that includes a main body 7201, a housing 7202, a display portion 7203, a keyboard 7204, an external connection port 7205, a pointing device 7206, and the like. This computer is fabricated using the display device for the display portion 7203.

Figure 10C:
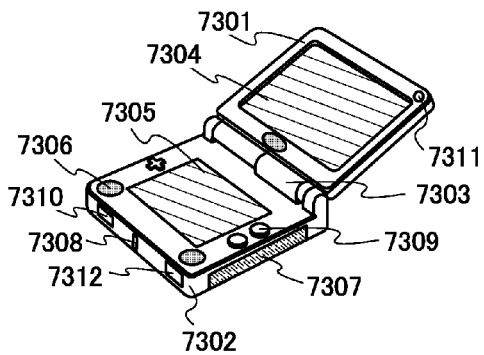

FIG. 10C illustrates a portable game console that includes two housings, a housing 7301 and a housing 7302, which are connected with a joint portion 7303 so that the portable game console can be opened or folded. A display portion 7304 is incorporated in the housing 7301, and a display portion 7305 is incorporated in the housing 7302. The portable game console in FIG. 10C also includes a speaker portion 7306, a recording medium insertion portion 7307, an LED lamp 7308, input means (an operation key 7309, a connection terminal 7310, a sensor 7311 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, tilt angle, vibration, smell, or infrared rays), and a microphone 7312), and the like. Needless to say, without limitation to the above structure, the portable game console can include other accessories as appropriate as long as the display device is used for at least one of the display portions 7304 and 7305. The portable game console in FIG. 10C has a function of reading a program or data stored in a recording medium to display it on the display portion, and a function of sharing information with another portable game console by wireless communication. The portable game console in FIG. 10C can have a variety of functions without limitation to the above functions.

Figure 10D:
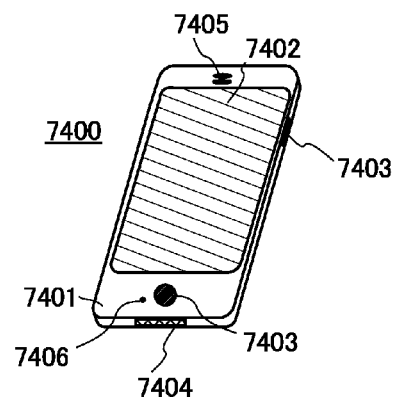

FIG. 10D illustrates an example of a mobile phone. A mobile phone 7400 includes a display portion 7402 incorporated in a housing 7401, an operation button 7403, an external connection port 7404, a speaker 7405, a microphone 7406, and the like. The mobile phone 7400 is fabricated using the display device for the display portion 7402.

When the display portion 7402 of the mobile phone 7400 in FIG. 10D is touched with a finger or the like, data can be input into the mobile phone 7400. Operations such as making a call and creating an e-mail can be performed by touch on the display portion 7402 with a finger or the like.

There are mainly three screen modes of the display portion 7402. The first mode is a display mode mainly for displaying images. The second mode is an input mode mainly for inputting data such as text. The third mode is a display-and-input mode in which two modes of the display mode and the input mode are combined.

For example, in the case of making a call or creating an e-mail, a text input mode mainly for inputting text is selected for the display portion 7402 so that text displayed on the screen can be input. In that case, it is preferable to display a keyboard or number buttons on almost the entire screen of the display portion 7402.

When a detection device including a sensor for detecting inclination, such as a gyroscope or an acceleration sensor, is provided inside the mobile phone 7400, display on the display portion 7402 can be automatically changed by determining the orientation of the mobile phone 7400 (whether the mobile phone is placed horizontally or vertically for a landscape mode or a portrait mode).

The screen modes are switched by touching the display portion 7402 or operating the operation button 7403 of the housing 7401. Moreover, the screen modes can be switched depending on kinds of images displayed on the display portion 7402. For example, when a signal of an image displayed on the display portion is a signal of moving image data, the screen mode is switched to the display mode. When the signal is a signal of text data, the screen mode is switched to the input mode.

In the input mode, when input by touching the display portion 7402 is not performed within a specified period while a signal is detected by an optical sensor in the display portion 7402, the screen mode may be controlled so as to be switched from the input mode to the display mode.

The display portion 7402 can also function as an image sensor. For example, an image of a palm print, a fingerprint, or the like is taken by touch on the display portion 7402 with the palm or the finger, whereby personal authentication can be performed. When a backlight or a sensing light source that emits near-infrared light is provided in the display portion, an image of a finger vein, a palm vein, or the like can be taken.

Figure 11A:
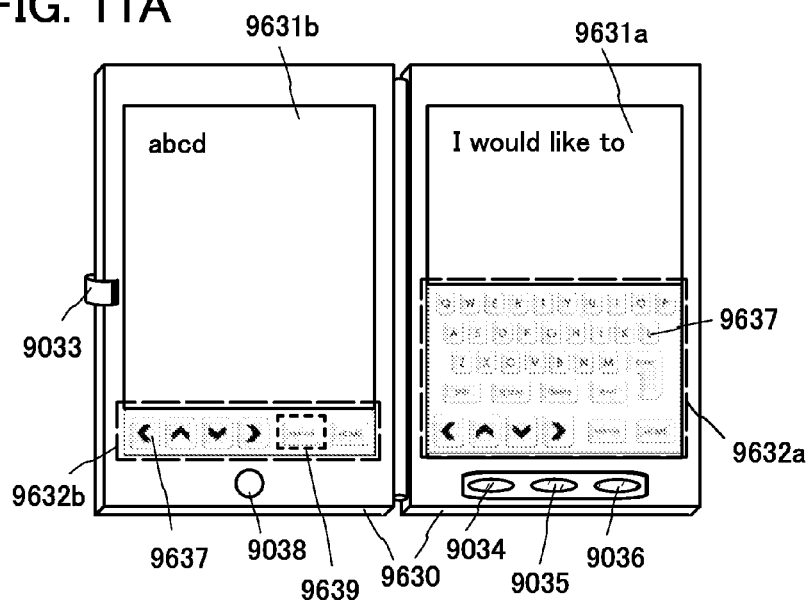
FIGS. 11A to 11C are diagrams illustrating an electronic device according to one embodiment of the present invention.
Figure 11B:
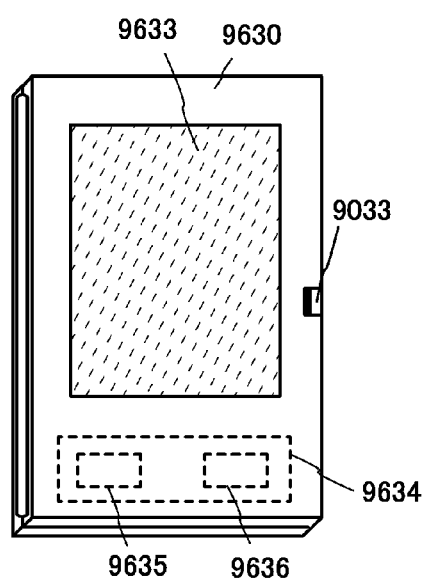

FIGS. 11A and 11B illustrate a tablet terminal that can be folded. In FIG. 11A, the tablet terminal is opened, and includes a housing 9630, a display portion 9631a, a display portion 9631b, a display-mode switching button 9034, a power button 9035, a power-saving-mode switching button 9036, a clip 9033, and an operation button 9038. The tablet terminal is manufactured using the display device for one or both of the display portion 9631a and the display portion 9631b.

A touch panel area 9632a can be provided in a part of the display portion 9631a, in which area, data can be input by touching displayed operation keys 9637. Note that half of the display portion 9631a has only a display function and the other half has a touch panel function. However, an embodiment of the present invention is not limited to this structure, and the whole display portion 9631a may have a touch panel function. For example, a keyboard can be displayed on the whole display portion 9631a to be used as a touch panel, and the display portion 9631b can be used as a display screen.

A touch panel area 9632b can be provided in part of the display portion 9631b like in the display portion 9631a. When a keyboard display switching button 9639 displayed on the touch panel is touched with a finger, a stylus, or the like, a keyboard can be displayed on the display portion 9631b.

The touch panel area 9632a and the touch panel area 9632b can be controlled by touch input at the same time.

The display-mode switching button 9034 allows switching between a landscape mode and a portrait mode, color display and black-and-white display, and the like. The power-saving-mode switching button 9036 allows optimizing the display luminance in accordance with the amount of external light in use which is detected by an optical sensor incorporated in the tablet terminal. In addition to the optical sensor, other detecting devices such as sensors for detecting inclination, like a gyroscope or an acceleration sensor, may be incorporated in the tablet terminal.

Although the display portion 9631a and the display portion 9631b have the same display area in FIG. 11A, an embodiment of the present invention is not limited to this example. The display portion 9631a and the display portion 9631b may have different areas or different display quality. For example, higher definition images may be displayed on one of the display portions 9631a and 9631b.

FIG. 11B illustrates the tablet terminal folded, which includes the housing 9630, a solar battery 9633, a charge and discharge control circuit 9634, a battery 9635, and a DCDC converter 9636. Note that FIG. 11B shows an example in which the charge and discharge control circuit 9634 includes the battery 9635 and the DCDC converter 9636.

Since the tablet terminal can be folded, the housing 9630 can be closed when not in use. Thus, the display portions 9631a and 9631b can be protected, which makes it possible to provide a tablet terminal with high durability and improved reliability for long-term use.

The tablet terminal illustrated in FIGS. 11A and 11B can have other functions such as a function of displaying various kinds of data (e.g., a still image, a moving image, and a text image), a function of displaying a calendar, a date, the time, or the like on the display portion, a touch-input function of operating or editing the data displayed on the display portion by touch input, and a function of controlling processing by various kinds of software (programs).

The solar battery 9633, which is attached on the surface of the tablet terminal, supplies electric power to a touch panel, a display portion, an image signal processor, and the like. Note that a structure in which the solar battery 9633 is provided on one or both surfaces of the housing 9630 is preferable because the battery 9635 can be charged efficiently. The use of a lithium ion battery as the battery 9635 is advantageous in downsizing or the like.

Figure 11C:
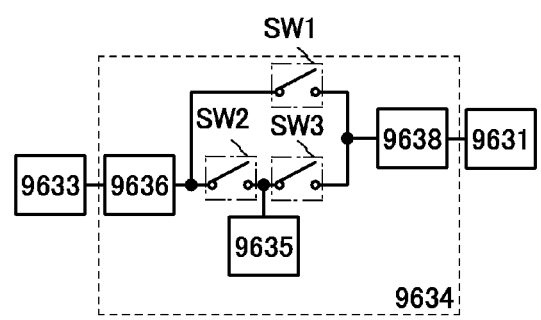

The structure and operation of the charge and discharge control circuit 9634 illustrated in FIG. 11B are described with reference to a block diagram of FIG. 11C. FIG. 11C illustrates the solar battery 9633, the battery 9635, the DCDC converter 9636, a converter 9638, switches SW1 to SW3, and the display portion 9631. The battery 9635, the DCDC converter 9636, the converter 9638, and the switches SW1 to SW3 correspond to the charge and discharge control circuit 9634 in FIG. 11B.

First, description is made on an example of the operation in the case where power is generated by the solar battery 9633 using external light. The voltage of power generated by the solar battery 9633 is raised or lowered by the DCDC converter 9636 so that a voltage for charging the battery 9635 is obtained. When the display portion 9631 is operated with the power from the solar battery 9633, the switch SW1 is turned on and the voltage of the power is raised or lowered by the converter 9638 to a voltage needed for operating the display portion 9631. When display is not performed on the display portion 9631, the switch SW1 is turned off and the switch SW2 is turned on so that the battery 9635 can be charged.

Although the solar battery 9633 is shown as an example of a charge means, there is no particular limitation on the charge means and the battery 9635 may be charged with another means such as a piezoelectric element or a thermoelectric conversion element (Peltier element). For example, the battery 9635 may be charged with a non-contact power transmission module which is capable of charging by transmitting and receiving power by wireless (without contact), or another charge means used in combination.

It is needless to say that an embodiment of the present invention is not limited to the electronic device illustrated in FIGS. 11A to 11C as long as the protection circuit described in the above embodiment is included.

The above-described electronic device includes a protection circuit according to one embodiment of the present invention. Therefore, the influence of ESD in the electronic device can be efficiently reduced and the electronic device can exhibit very high reliability.

Note that a protection circuit according to one embodiment of the present invention can be used not only in the above-described display device but also in any electronic unit which includes at least an external input terminal. The influence of ESD in a unit including the protection circuit can be efficiently suppressed and the reliability of the unit can be increased. For example, the protection circuit can be directly used in nonvolatile memory devices, such as flash memories, volatile memory devices, such as DRAMs and SRAMs, and electronic units including CPUs, such as various ICs. Moreover, the reliability of an electronic device including such an electronic unit can also be increased.

This embodiment can be implemented in combination with any of the other embodiments disclosed in this specification as appropriate. This application is based on Japanese Patent Application serial No. 2011-200896 filed with Japan Patent Office on Sep. 14, 2011, the entire contents of which are hereby incorporated by reference.

What is claimed is:

1. A semiconductor device comprising:
a display portion comprising at least one pixel;
an external input terminal to which a signal from the outside is input; and
a protection circuit comprising a first transistor between the display portion and the external input terminal,
wherein the first transistor comprises:
a semiconductor layer comprising a channel formation region,
a pair of gate electrodes with the semiconductor layer provided therebetween,
a first electrode electrically connected to the semiconductor layer, and
a second electrode electrically connected to the semiconductor layer,
wherein one of the pair of gate electrodes is electrically connected to one of the first electrode and the second electrode,
wherein the other of the pair of gate electrodes is electrically connected to a common potential wiring, and
wherein the common potential wiring is provided along at least a part of the display portion.

2. The semiconductor device according to claim 1,
wherein the semiconductor layer comprises an oxide semiconductor layer.

3. The semiconductor device according to claim 1,
wherein one of the first electrode and the second electrode of the first transistor is electrically connected to a first wiring between the display portion and the external input terminal, and
wherein the other of the first electrode and the second electrode of the first transistor is electrically connected to a second wiring.

4. The semiconductor device according to claim 1,
wherein the pixel comprises a light-emitting element, and
wherein a material of one of the pair of gate electrodes is the same as that of a pixel electrode of the light-emitting element.

5. The semiconductor device according to claim 1,
wherein the pixel comprises a liquid crystal element, and
wherein a material of one of the pair of gate electrodes is the same as that of a pixel electrode of the liquid crystal element.

6. A semiconductor device comprising:
a display portion comprising at least one pixel;
an external input terminal to which a signal from the outside is input; and
a protection circuit comprising a first transistor and a second transistor, between the display portion and the external input terminal,
wherein each of the first transistor and the second transistor comprises:
a semiconductor layer comprising a channel formation region,
a pair of gate electrodes with the semiconductor layer provided therebetween,
a first electrode electrically connected to the semiconductor layer, and
a second electrode electrically connected to the semiconductor layer,
wherein one of the pair of gate electrodes is electrically connected to one of the first electrode and the second electrode,
wherein the other of the pair of gate electrodes is electrically connected to a common potential wiring, and
wherein the common potential wiring is provided to surround the display portion.

7. The semiconductor device according to claim 6,
wherein the semiconductor layer comprises an oxide semiconductor layer.

8. The semiconductor device according to claim 6,
wherein one of the first electrode and the second electrode of each of the first transistor and the second transistor is electrically connected to a first wiring between the display portion and the external input terminal,
wherein the other of the first electrode and the second electrode of the first transistor is electrically connected to a second wiring, and
wherein the other of the first electrode and the second electrode of the second transistor is electrically connected to a third wiring.

9. The semiconductor device according to claim 6,
wherein the pixel comprises a light-emitting element, and
wherein a material of one of the pair of gate electrodes is the same as that of a pixel electrode of the light-emitting element.

10. The semiconductor device according to claim 6,
wherein the pixel comprises a liquid crystal element, and
wherein a material of one of the pair of gate electrodes is the same as that of a pixel electrode of the liquid crystal element.

11. The semiconductor device according to claim 6,
wherein the common potential wiring forms a closed curve to surround the display portion.

12. A semiconductor device comprising:
a display portion comprising at least one pixel;
a driver circuit;
an external input terminal to which a signal from the outside is input;
a first protection circuit comprising a first transistor and a second transistor, between the display portion and the external input terminal; and
a second protection circuit comprising a third transistor and a fourth transistor, between the driver circuit and the external input terminal,
wherein each of the first transistor, the second transistor, the third transistor and the fourth transistor comprises:
a semiconductor layer comprising a channel formation region,
a pair of gate electrodes with the semiconductor layer provided therebetween,
a first electrode electrically connected to the semiconductor layer, and
a second electrode electrically connected to the semiconductor layer,
wherein one of the pair of gate electrodes is electrically connected to one of the first electrode and the second electrode,
wherein the other of the pair of gate electrodes is electrically connected to a common potential wiring, and
wherein the common potential wiring is provided to surround the display portion and the driver circuit.

13. The semiconductor device according to claim 12,
wherein the semiconductor layer comprises an oxide semiconductor layer.

14. The semiconductor device according to claim 12,
wherein one of the first electrode and the second electrode of each of the first transistor and the second transistor is electrically connected to a first wiring between the display portion and the external input terminal, wherein one of the first electrode and the second electrode of each of the third transistor and the fourth transistor is electrically connected to a second wiring between the driver circuit and the external input terminal, wherein the other of the first electrode and the second electrode of the first transistor is electrically connected to a third wiring, wherein the other of the first electrode and the second electrode of the second transistor is electrically connected to a fourth wiring, wherein the other of the first electrode and the second electrode of the third transistor is electrically connected to a fifth wiring, and wherein the other of the first electrode and the second electrode of the fourth transistor is electrically connected to a sixth wiring.

15. The semiconductor device according to claim 12,
wherein the pixel comprises a light-emitting element, and
wherein a material of one of the pair of gate electrodes is the same as that of a pixel electrode of the light-emitting element.

16. The semiconductor device according to claim 12,
wherein the pixel comprises a liquid crystal element, and
wherein a material of one of the pair of gate electrodes is the same as that of a pixel electrode of the liquid crystal element.

17. The semiconductor device according to claim 12,
wherein the common potential wiring forms a closed curve to surround the display portion and the driver circuit.

* * * * *